United States Patent
Yen

(10) Patent No.: US 11,482,480 B2
(45) Date of Patent: Oct. 25, 2022

(54) PACKAGE SUBSTRATE INCLUDING AN OPTICALLY-CURED DIELECETRIC LAYER AND METHOD FOR MANUFACTURING THE PACKAGE SUBSTRATE

(71) Applicant: Advanced Semiconductor Engineering, Inc., Kaohsiung (TW)

(72) Inventor: You-Lung Yen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/824,423

(22) Filed: Mar. 19, 2020

(65) Prior Publication Data

US 2021/0296219 A1 Sep. 23, 2021

(51) Int. Cl.
*H01L 23/498* (2006.01)
*H01L 21/48* (2006.01)
(Continued)

(52) U.S. Cl.
CPC ...... *H01L 23/49816* (2013.01); *H01L 21/486* (2013.01); *H01L 21/565* (2013.01);
(Continued)

(58) Field of Classification Search
CPC ....... H01L 24/13; H01L 24/29; H01L 21/568; H01L 21/6835; H01L 2021/6006;
(Continued)

(56) References Cited

U.S. PATENT DOCUMENTS 8,569,894 B2 10/2013 Su et al.
10,440,819 B2 * 10/2019 Vincent .................. H01L 24/97
(Continued)

FOREIGN PATENT DOCUMENTS

| CN | 104752391 A | * | 7/2015 | ............ H01L 24/73 |
| TW | 201507084 A | | 2/2015 | |
| TW | 201822325 A | | 6/2018 | |

OTHER PUBLICATIONS

Office Action for Corresponding Taiwanese Patent Application No. 109123815, dated Jan. 22, 2022, 6 pages.
(Continued)

*Primary Examiner* — Khiem D Nguyen
(74) *Attorney, Agent, or Firm* — Foley & Lardner LLP

(57) ABSTRACT

A package substrate and method of manufacturing a package substrate and a semiconductor device package are provided. The package substrate includes a circuit layer, an optically-cured dielectric layer, a plurality of block layers and a sacrificial layer. The circuit layer includes a plurality of conductive pads. The optically-cured dielectric layer has an upper surface and a lower surface opposite to the upper surface. The optically-cured dielectric layer covers the circuit layer, and first surfaces of the conductive pads are at least partially exposed from the upper surface of the optically-cured dielectric layer. The block layers are respectively disposed on the first surfaces of the conductive pads exposed by the optically-cured dielectric layer. The sacrificial layer is disposed on the optically-cured dielectric layer and covering the block layers.

21 Claims, 31 Drawing Sheets

(51) Int. Cl.
*H01L 21/56* (2006.01)
*H01L 23/31* (2006.01)
*H01L 23/538* (2006.01)
*H01L 23/00* (2006.01)
*H01L 25/065* (2006.01)

(52) U.S. Cl.
CPC ...... *H01L 23/3114* (2013.01); *H01L 23/3128* (2013.01); *H01L 23/49827* (2013.01); *H01L 23/5384* (2013.01); *H01L 24/13* (2013.01); *H01L 24/29* (2013.01); *H01L 24/45* (2013.01); *H01L 25/0655* (2013.01)

(58) Field of Classification Search
CPC ....... H01L 2221/68304; H01L 25/0655; H01L 2224/16245; H01L 2224/48228; H01L 2224/48248; H01L 2224/92247; H01L 2224/81005; H01L 21/486; H01L 21/565; H01L 23/49816; H01L 23/3114; H01L 23/3128; H01L 23/49827; H01L 23/5384; H01L 24/16; H01L 24/32; H01L 24/45; H01L 24/48; H01L 24/73; H01L 24/81; H01L 24/85

USPC .................................................. 438/106, 613
See application file for complete search history.

(56) References Cited

U.S. PATENT DOCUMENTS

| | | | |
|---|---|---|---|
| 2008/0105967 A1* | 5/2008 | Yang | H01L 24/19 257/690 |
| 2009/0236738 A1* | 9/2009 | Shim | H05K 3/3452 257/737 |
| 2011/0195223 A1* | 8/2011 | Bchir | H05K 3/3452 428/138 |
| 2016/0133562 A1* | 5/2016 | Lee | H01L 23/49822 257/774 |
| 2016/0322295 A1* | 11/2016 | Kobayashi | H01L 23/49816 |
| 2018/0366411 A1* | 12/2018 | Suk | H01L 21/565 |
| 2020/0144168 A1* | 5/2020 | Lu | H01L 21/4857 |

OTHER PUBLICATIONS

Search Report with English Translation for Corresponding Taiwanese Patent Application No. 109123815, dated Jan. 22, 2022, 2 pages.

* cited by examiner

PACKAGE SUBSTRATE INCLUDING AN OPTICALLY-CURED DIELECETRIC LAYER AND METHOD FOR MANUFACTURING THE PACKAGE SUBSTRATE

BACKGROUND

1. Technical Field

The present disclosure relates to a package substrate and manufacturing method thereof, and more particularly, to a package substrate with thin thickness and sufficient structural strength and manufacturing method thereof.

2. Description of the Related Art

As compact size and high performance have become typical requirements of consumer electronic and communication products, semiconductor device packages are expected to possess superior electrical properties, thin overall thickness and a large number of I/O ports. In order to provide sufficient structural strength for supporting semiconductor dies and electronic components formed thereon, the package substrate needs to be thick enough. Normally, the thickness of the package substrate needs to exceed 100 micrometers to provide sufficient structural strength. The thick thickness of the package substrate, however, increases the overall thickness of the semiconductor device package.

It is therefore desirable to develop a package substrate with thin thickness but sufficient structural strength to meet the compactness requirement of consumer electronic and communication products.

SUMMARY

One aspect of the present disclosure relates to a package substrate. In some embodiments, the package substrate includes a circuit layer, an optically-cured dielectric layer, a plurality of block layers and a sacrificial layer. The circuit layer includes a plurality of conductive pads. The optically-cured dielectric layer has an upper surface and a lower surface opposite to the upper surface. The optically-cured dielectric layer covers the circuit layer, and first surfaces of the conductive pads are at least partially exposed from the upper surface of the optically-cured dielectric layer. The block layers are respectively disposed on the first surfaces of the conductive pads exposed by the optically-cured dielectric layer. The sacrificial layer is disposed on the optically-cured dielectric layer and covering the block layers.

Another aspect of the present disclosure relates to a method of manufacturing a package substrate. In some embodiments, the method includes the following operations. A circuit layer including a plurality of conductive pads is formed. An optically-sensitive material is formed to cover the conductive pads. The optically-sensitive material is optically cured to form an optically-cured dielectric layer having a plurality of openings partially exposing first surfaces of the conductive pads. A plurality of block layers is formed in the openings on the first surfaces of the conductive pads. A sacrificial layer is formed on the optically-cured dielectric layer and on the block layers.

Another aspect of the present disclosure relates to a method of manufacturing a semiconductor device package. In some embodiments, the method includes the following operations. The above mentioned package substrate is provided. A die is disposed on the optically-cured dielectric layer and the die is electrically connected to the conductive pads. A molding layer is formed on the optically-cured dielectric layer to encapsulate the die. The sacrificial layer is removed from the optically-cured dielectric layer and the block layers. A plurality of electrical conductors is formed on the block layers

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

DETAILED DESCRIPTION

Figure 1:
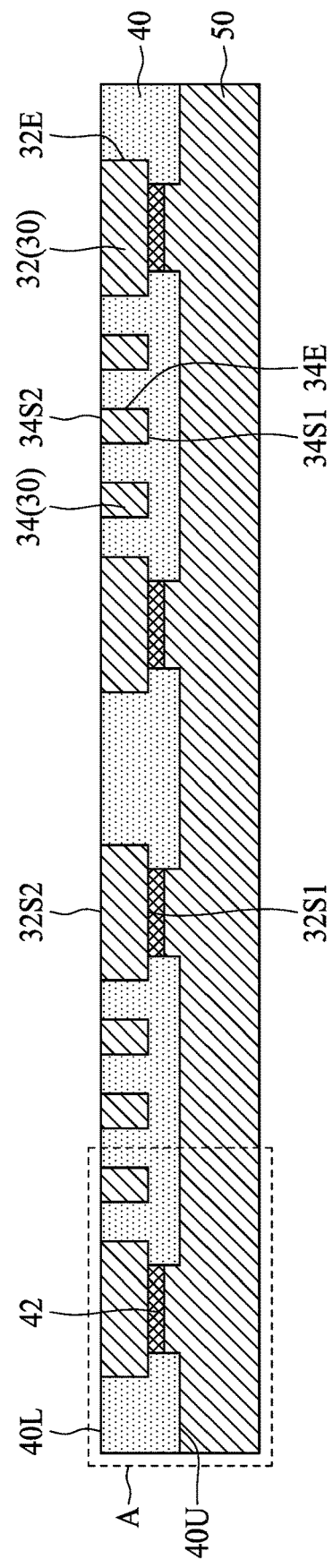
FIG. 1 is a schematic cross-sectional view of a package substrate in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Present disclosures provide package substrates with thin thickness and strong robustness. The package substrate may be configured to support semiconductor dies and/or electronic components, and to electrically connect the semiconductor dies and the electronic components to external electronic device such as printed circuit board. The package substrate may be an intermediate product, which includes a sacrificial layer temporarily supporting a circuit layer. The sacrificial layer can enhance the structural strength of the package substrate, and can be easily removed after the semiconductor die and/or electronic component are formed and encapsulated by an encapsulant. Accordingly, the overall thickness of the final product such as a semiconductor device package can be reduced. The optically-cured dielectric layer can be patterned by optical curing such as UV curing rather than grinding, and thus no additional thickness for the thickness tolerance of grinding process is required. Accordingly, the thickness of the package substrate can be further thinned.

As used herein, the term "optically-cured dielectric layer" may refer to a dielectric layer able to be patterned by optical curing. In some embodiments, the optically-cured dielectric layer may be formed by optically curing an optical-sensitive dielectric material through a photomask with an irradiation such as UV light, and developing the cured optical-sensitive dielectric material.

FIG. 1 is a schematic cross-sectional view of a package substrate 1 in accordance with some embodiments of the present disclosure. As shown in FIG. 1, the package substrate 1 includes a circuit layer 30, an optically-cured dielectric layer 40, a plurality of block layers 42 and a sacrificial layer 50. The circuit layer 30 may include a plurality of conductive pads 32. The conductive pads 32 each may include a first surface 32S1, a second surface 32S2 opposite to the first surface 32S1, and an edge 32E connecting the first surface 32S1 to the second surface 32S2. The circuit layer 30 may further include conductive traces 34. The conductive traces 34 each may include a first surface 34S1, a second surface 34S2 opposite to the first surface 34S1, and an edge 34E connecting the first surface 34S1 to the second surface 34S2. In some embodiments, the width of the conductive pad 32 may be wider than, but is not limited to be, the width of the conductive trace 34. In some embodiments, the conductive traces 34 and the conductive pads 32 may include conductive material such as metal including copper or the like. In some embodiments, the conductive traces 34 and the conductive pads 32 may be substantially equal in thickness and are disposed at substantially a same horizontal level.

The optically-cured dielectric layer 40 includes an upper surface 40U and a lower surface 40L opposite to the upper surface 40U. In some embodiments, the upper surface 40U of the optically-cured dielectric layer 40 may be a solder side (ball side) of the package substrate 1 for disposing electrical conductors such as solders, and the lower surface 40L may be a component side of the package substrate 1 for disposing electronic components such as die. The optically-cured dielectric layer 40 may cover the circuit layer 30, and the first surfaces 32S1 of the conductive pads 32 are at least partially exposed from the upper surface 40U of the optically-cured dielectric layer 40, while the first surface 34S1 of the conductive traces 34 may be covered by the optically-cured dielectric layer 40. In some embodiments, the edges 32E of the conductive pads 32 and the edges 34E of the conductive traces 34 are covered by the optically-cured dielectric layer 40. The circuit layer 30 may include a single-layered circuit layer, and second surfaces 32S2 of the conductive pads 32 and the second surfaces 34S2 of the conductive traces 34 may be exposed from the lower surface 40L of the optically-cured dielectric layer 40. In some embodiments, the second surfaces 32S2 of the conductive pads 32, the second surfaces 34S2 of the conductive traces 34 and the lower surface 40L of the optically-cured dielectric layer 40 may be substantially coplanar. In some embodiments, the first surfaces 32S1 of the conductive pads 32 and the first surfaces 34S1 of the conductive traces 34 may be substantially coplanar. In some embodiments, the first surface 32S1 and/or the second surface 32S2 of the conductive pad 32 are configured to receive electrical connectors such as solder balls, solder bumps, metal posts, metal pillars or the like. In some embodiments, the second surface 34S2 of the conductive trace 34 may be configured to receive electrical connectors such as solder balls, solder bumps, metal posts, metal pillars or the like.

The circuit layer 30 may be at least partially embedded in the optically-cured dielectric layer 40, and adjacent conductive traces 34 and/or conductive pads 32 may be spaced by the optically-cured dielectric layer 40. The optically-cured dielectric layer 40 may partially cover the conductive traces 34 and the conductive pads 32. Since the circuit layer 30 is embedded in the optically-cured dielectric layer 40, the overall thickness of the circuit layer 30 and the optically-cured dielectric layer 40 can be mainly decided by the thickness of the optically-cured dielectric layer 40. In some embodiments, the thickness of the optically-cured dielectric layer 40 is substantially equal to or thinner than 50 micrometers, thinner than 40 micrometers or even thinner to meet the thin thickness requirement.

The material of the optically-cured dielectric layer 40 may include optically-sensitive material such as photoresist. The optically-cured dielectric layer 40 may be patterned to expose the conductive pads 32 by optically curing the optically-sensitive material. Accordingly, the conductive pads 32 are not damaged when patterning the optically-cured dielectric layer 40. In addition, the optically-cured dielectric layer 40 allows minimizing the thickness of the conductive pads 32 because no additional thickness for the thickness tolerance of grinding process is required. Accordingly, the thickness of the package substrate 1 can be further thinned.

The block layers 42 are respectively disposed on the first surfaces 32S1 of the conductive pads 32 exposed by the optically-cured dielectric layer 40. The sacrificial layer 50 is disposed on the optically-cured dielectric layer 40 and covers the block layers. 42. The sacrificial layer 50 covers the upper surface 40U of the optically-cured dielectric layer 40, and the first surfaces 32S1 of the conductive pads 32. In some embodiments, the sacrificial layer 50 may include a conductive layer such as a copper layer. In some embodiments, the conductive layer may be formed by electroplating. The block layers 42 may also be referred to as pre-plated frames (PPFs) or etching stop layers. The material of the block layers 42 is different from that of the sacrificial layer 50 such that the block layers 42 and the sacrificial layer 50 may have distinct etching selectivity. Accordingly, the block layers 42 may be configured as etching stop layers during etching the sacrificial layer 50, and the conductive pads 32 are not damaged during removal of the sacrificial layer 50. Examples of the material of the block layers 42 may include, but is not limited to, nickel (Ni), palladium (Pd), gold (Au) or a combination thereof, and example of the material of the sacrificial layer 50 and the conductive pad 32 may include, but is not limited to, copper. The block layers 42 may be a single-layered structure including nickel (Ni), palladium (Pd), gold (Au) or an alloy thereof, or a multi-layered structure with layers each including nickel (Ni), palladium (Pd) or gold (Au).

In some embodiments, there is no air gap between the block layers 42 and the sacrificial layer 50, and between the block layers 42 and the conductive pads 32. By way of example, block layers 42 may be in contact with the first surfaces 32S1 of the conductive pads 32 and the sacrificial layer 50. Since no air gap is formed between the block layers 42 and the sacrificial layer 50, and between the block layers 42 and the conductive pads 32, popcorn issue due to air bubbles during successive thermal process may be avoided.

Figure 1A:
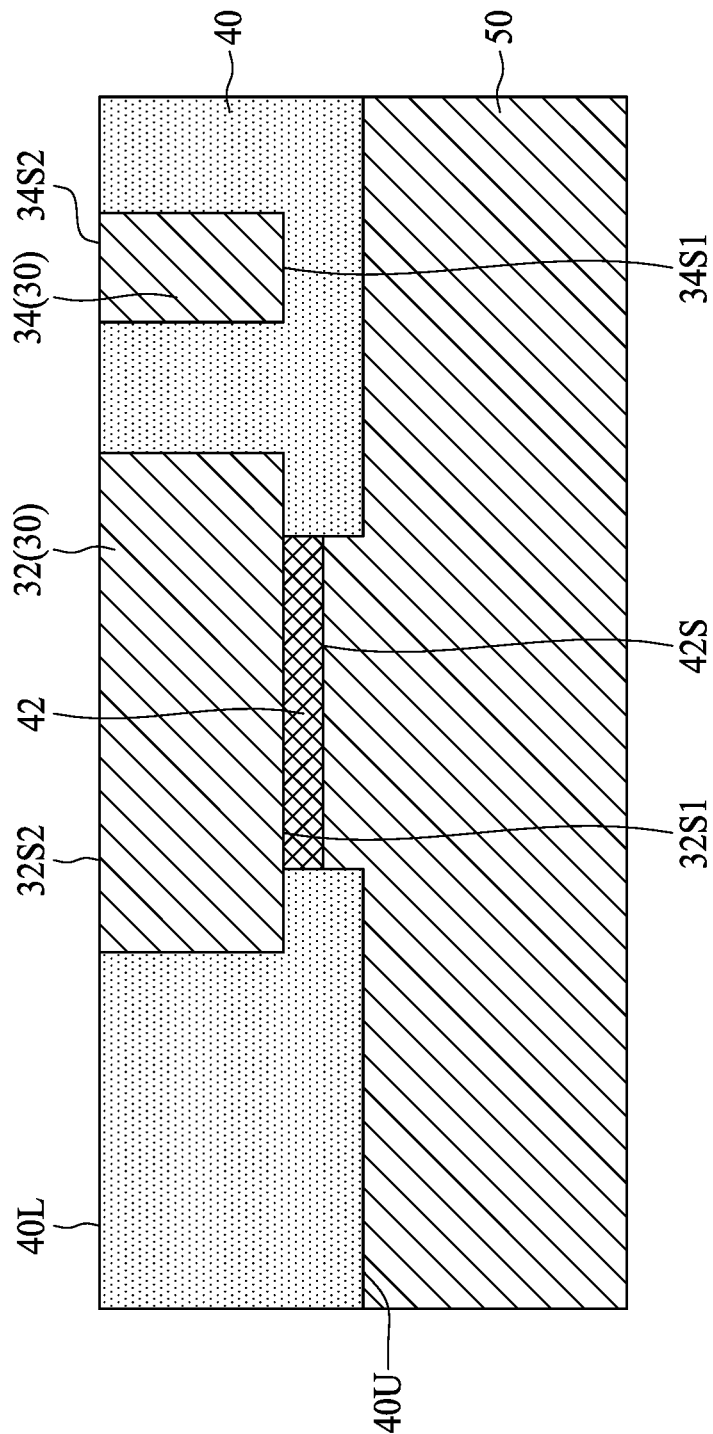
FIG. 1A, FIG. 1B and FIG. 1C are schematic cross-sectional views of region A of the package substrate 1 in FIG. 1 in accordance with some embodiments of the present disclosure.
Figure 1B:
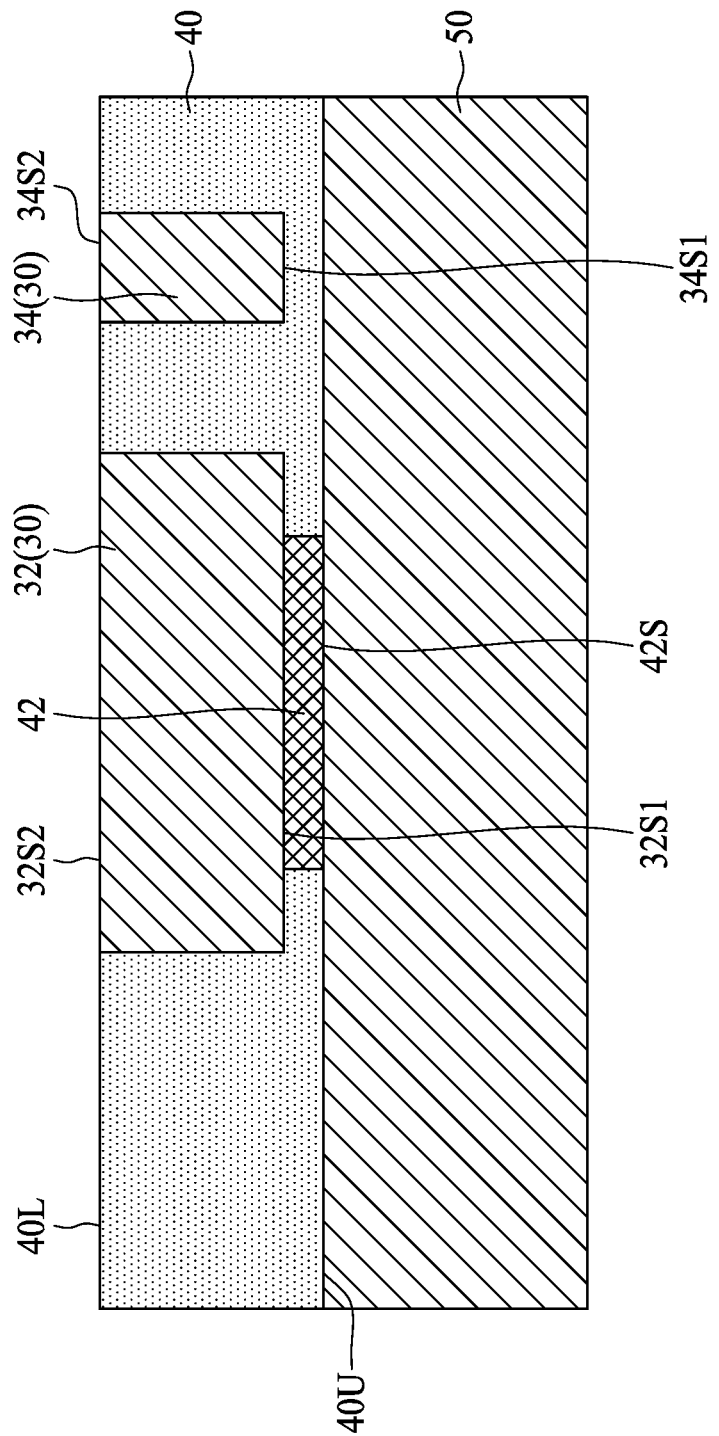
Figure 1C:
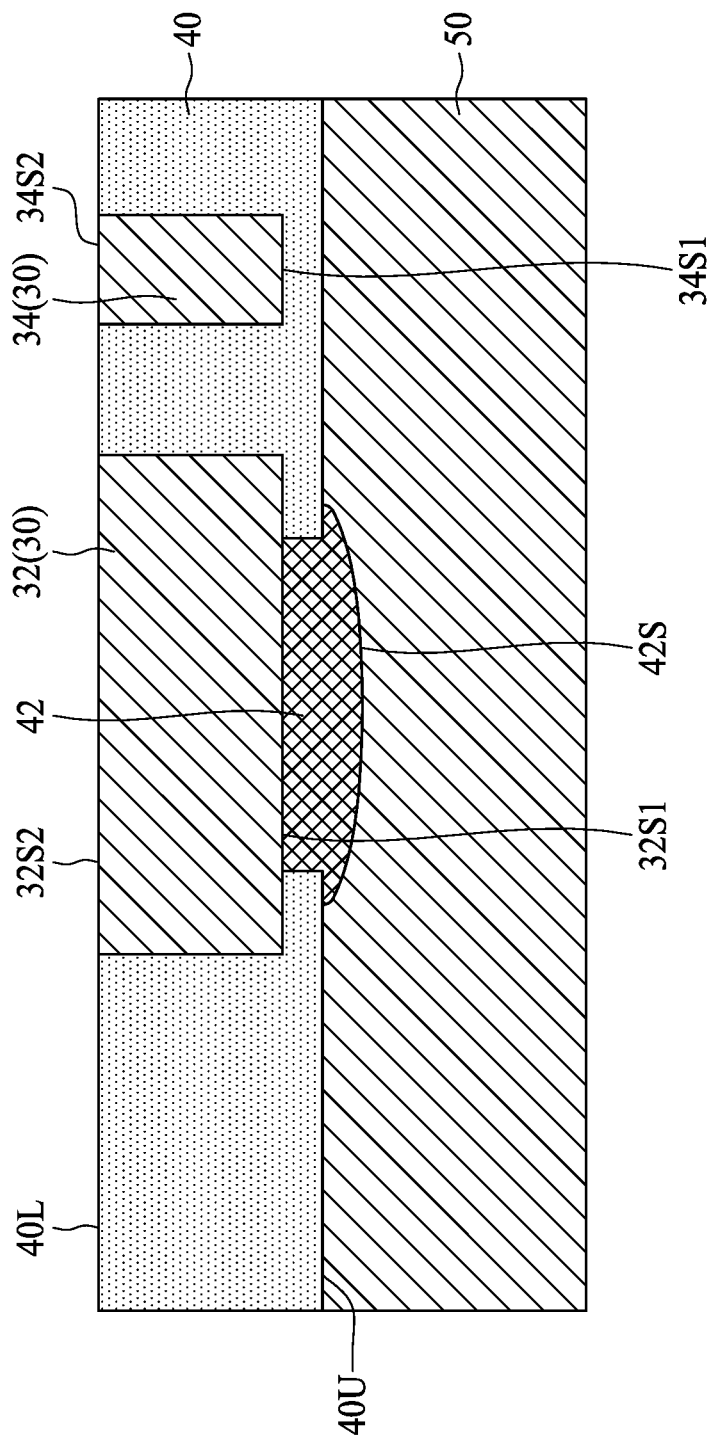

FIG. 1A, FIG. 1B and FIG. 1C are schematic cross-sectional views of region A of the package substrate 1 in FIG. 1 in accordance with some embodiments of the present disclosure. As shown in FIG. 1A, the surfaces 42S of the block layers 42 may be lower than the upper surface 40U of the optically-cured dielectric layer 40. A portion of the sacrificial layer 50 may be engaged with the optically-cured dielectric layer 40. As shown in FIG. 1B, the surfaces 42S of the block layers 42 may be substantially coplanar with the upper surface 40U of the optically-cured dielectric layer 40. As shown in FIG. 1C, the surfaces 42S of the block layers 42 may be higher than the upper surface 40U of the optically-cured dielectric layer 40. The block layers 42 may partially cover the upper surface 40U of the optically-cured dielectric layer 40. In some embodiments, the surface 42S of the block layer 42 may include a convex surface.

In some embodiments, the package substrate 1 is an intermediate product. The sacrificial layer 50 may be configured as a temporary enhancement layer to support the optically-cured dielectric layer 40 and the circuit layer 30 having a thin thickness. The sacrificial layer 50 will be removed after dies and/or other components are formed on the lower surface 40L of the optically-cured dielectric layer 40. The thickness of the sacrificial layer 50 can be selected to be less than, equal to or larger than the thickness of the optically-cured dielectric layer 40 as long as the sacrificial layer 50 can provide sufficient support for the optically-cured dielectric layer 40. Accordingly, the optically-cured dielectric layer 40 and the circuit layer 30 supported by the sacrificial layer 50 can be handled during transportation and successive processes. By way of examples, a thickness sum of a thickness of the sacrificial layer and a thickness of the optically-cured dielectric layer 40 is substantially equal to or greater than about 50 micrometers, substantially equal to or greater than about 80 micrometers, substantially equal to or greater than about 90 micrometers, substantially equal to or greater than about 100 micrometers, substantially equal to or greater than about 110 micrometers, or even greater. In some embodiments, the overall thickness of the optically-cured dielectric layer 40 with the embedded circuit layer 30 is ranging from about 10 micrometers and about 40 micrometers, and the thickness of the sacrificial layer 50 may be about one to ten times the overall thickness of the optically-cured dielectric layer 40 with the embedded circuit layer 30 such that the structural strength of the sacrificial layer 50 is sufficient to provide supporting force to the optically-cured dielectric layer 40 with the embedded circuit layer 30. By way of an example, the overall thickness of the optically-cured dielectric layer 40 with the embedded circuit layer 30 is about 10 micrometers, and the thickness of the sacrificial layer 50 is ranging from about 10 micrometers to about 100 micrometers.

Figure 2A:
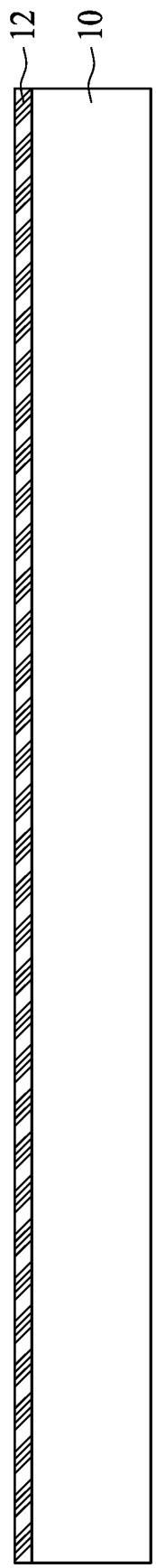
FIG. 2A, FIG. 2B, FIG. 2C, FIG. 2D, FIG. 2E, FIG. 2F and FIG. 2G illustrate operations of manufacturing a package substrate and a semiconductor device package in accordance with some embodiments of the present disclosure.

FIG. 2A, FIG. 2B, FIG. 2C, FIG. 2D, FIG. 2E, FIG. 2F, and FIG. 2G illustrate operations of manufacturing a package substrate and a semiconductor device package in accordance with some embodiments of the present disclosure. As shown in FIG. 2A, a carrier 10 such as a glass carrier, a plastic carrier or a semiconductor carrier is provided. A seed layer 12 may be optionally formed on the carrier 10. The seed layer 12 may include a thin metal layer such as a thin copper layer formed by electro-less plating or other suitable process.

Figure 2B:
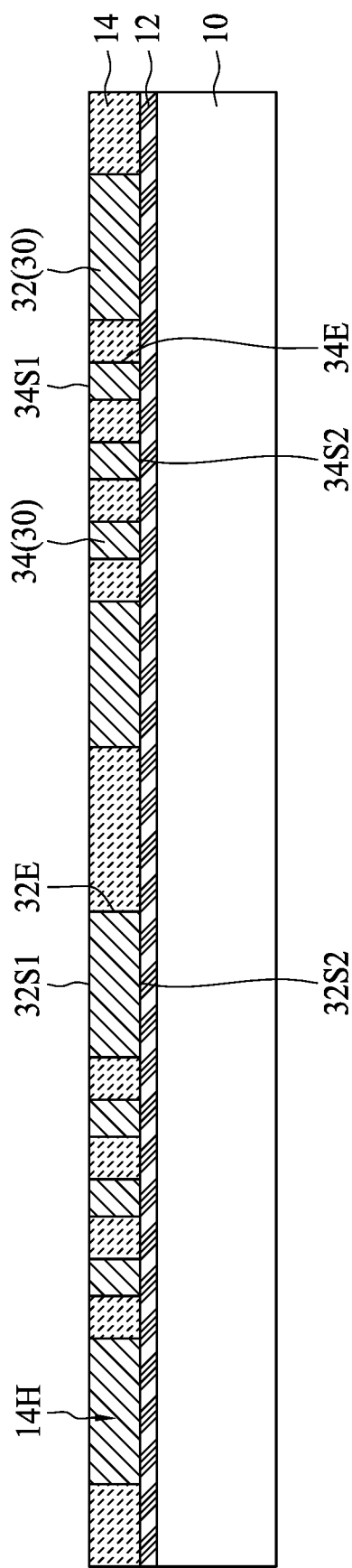

As shown in FIG. 2B, a circuit layer 30 is then formed on the carrier 10. The circuit layer 30 includes a plurality of conductive pads 32 and conductive traces 34. In some embodiments, a resist layer 14 with a plurality of openings 14H is formed on the carrier 10, and the conductive traces 34 and the conductive pads 32 are formed in the openings 14H. The resist layer 14 may include an optically-sensitive material such as a photoresist, and the openings 14H may be formed by exposure and development operations. The material of the circuit layer 30 may include metal such as copper. In some embodiments, the circuit layer 30 includes a single-layered structure, and the conductive traces 34 and the conductive pads 32 may be formed by the same electroplating on the seed layer 12. Therefore, the conductive traces 34 and the conductive pads 32 may be substantially equal in thickness.

Figure 2C:
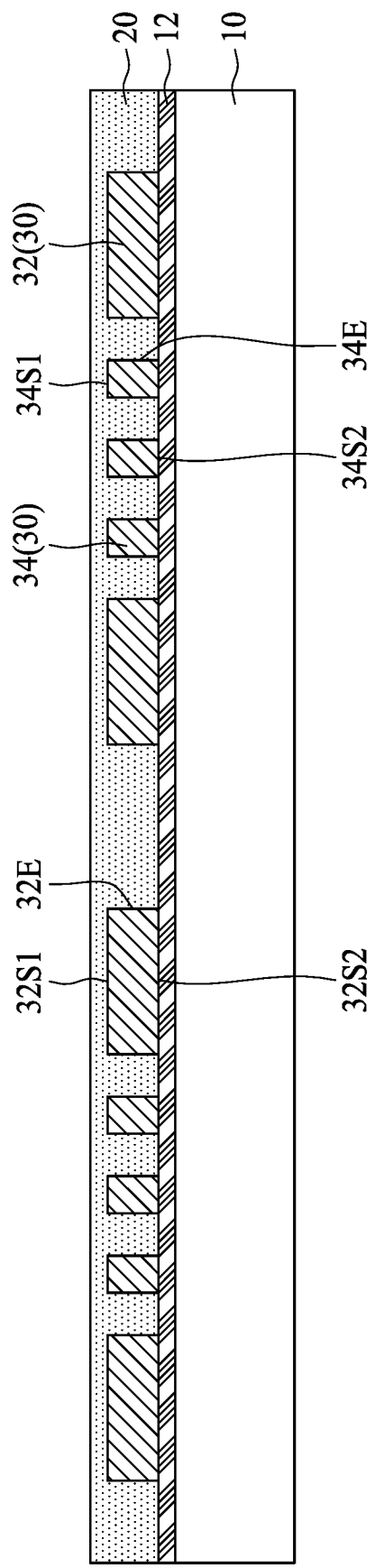
Figure 2D:
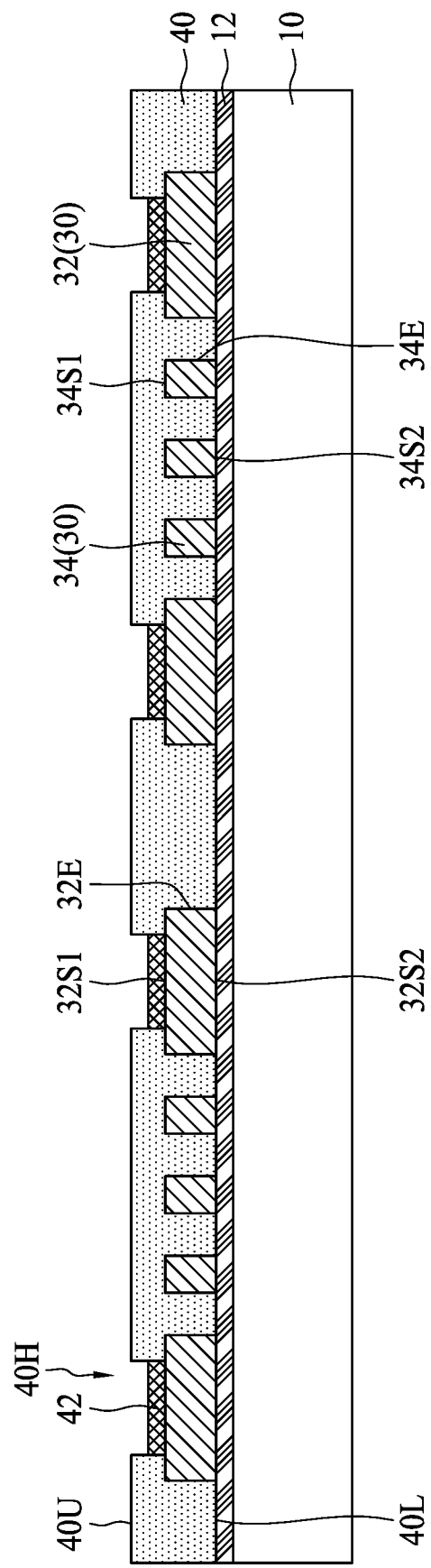

As shown in FIG. 2C, the resist layer 14 may be removed. An optically-sensitive material 20 is then formed on the carrier 10 covering the circuit layer 30. The optically-sensitive material 20 may include photoresist material, and can be patterned by exposure and development operations. As shown in FIG. 2D, the optically-sensitive material 20 is then optically cured to form an optically-cured dielectric layer 40 having a plurality of openings 40H at least partially exposing the first surfaces 32S1 of the conductive pads 32. In some embodiments, no thinning process such as a grinding process is required to expose the first surfaces 32S1 of the conductive pads 32, and the conductive pads 32 will not be damaged. Furthermore, the thickness of the conductive pads 32 can be designed to be as thin as possible since no additional thickness is required for the thickness tolerance of the thinning process. A plurality of block layers 42 are formed in the openings 40H on the first surfaces 32S1 of the conductive pads 32. The block layers 42 may be formed by electroplating or other suitable process.

Figure 2E:
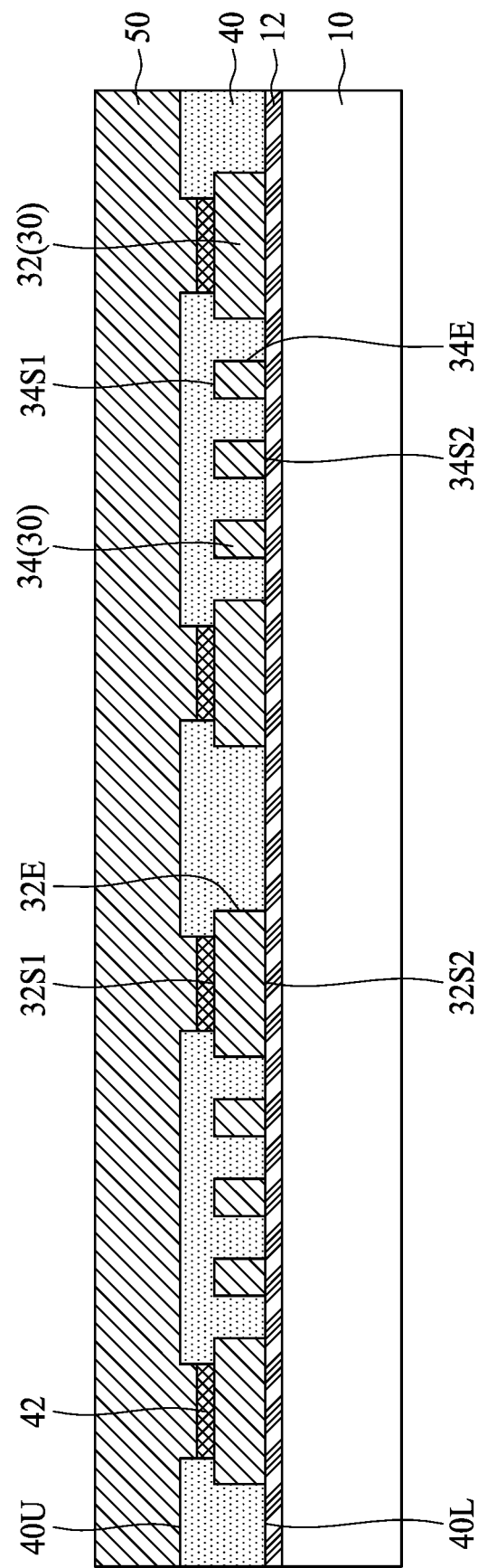

As shown in FIG. 2E, a sacrificial layer 50 is formed on the optically-cured dielectric layer 40 and on the block layers 42. In some embodiments, the sacrificial layer 50 includes a conductive layer such as a copper layer, and can be formed by electroplating or other suitable process. The sacrificial layer 50 can help to support the optically-cured dielectric layer 40 and the circuit layer 30, and thus the carrier 10 can be removed from the optically-cured dielectric layer 40. In case the seed layer 12 exists, the lower surface 40L of the optically-cured dielectric layer 40 can be treated by e.g., etching to remove the seed layer 12 to form the package substrate 1 as illustrated in FIG. 1. In some embodiments, the second surfaces 32S2 of the conductive pads 32 can be slightly lower than or coplanar with the lower surface 40L of the optically-cured dielectric layer 40 after the surface treatment.

Figure 2F:
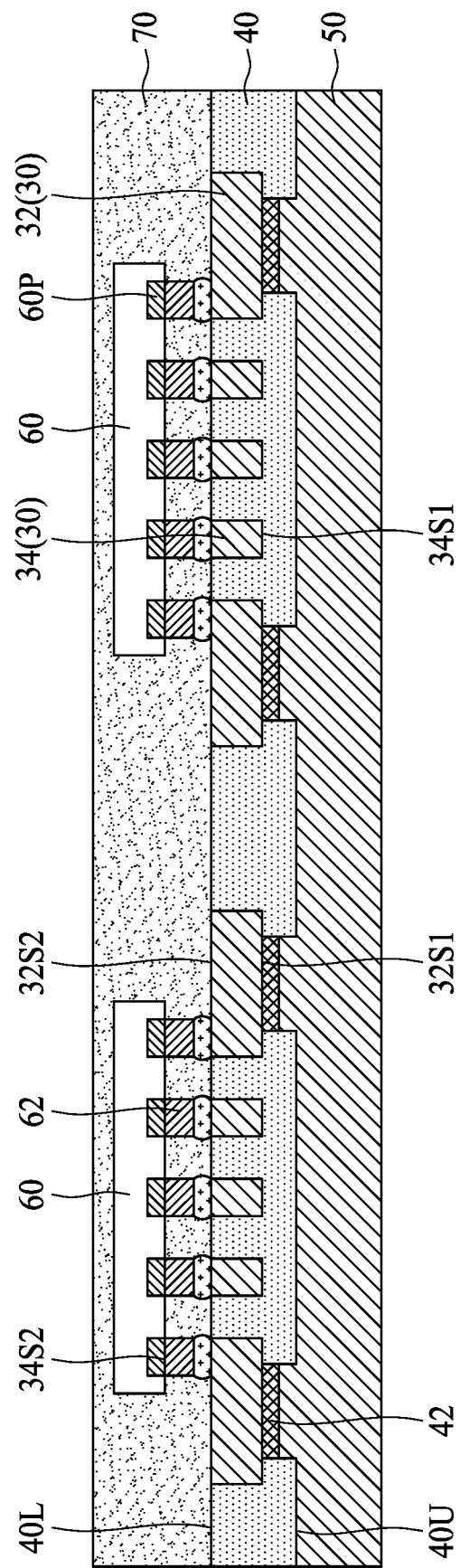

As shown in FIG. 2F, a plurality of dies 60 may be disposed on the optically-cured dielectric layer 40 and electrically connected to the conductive traces 34. In some embodiments, the dies 60 are electrically connected to the circuit layer 30 in a flip-chip manner. For example, the die 60 may include electrical terminals 60P such as bonding pads facing the circuit layer 30, and electrically connected to the conductive traces 34 and/or the conductive pads 32 through conductive structures 62 such as solder bumps, copper pillar or the like. In some other embodiments, the die 60 may be electrically connected to the conductive traces 34 and/or the conductive pads 32 through wire bonding. A molding layer 70 may be formed on the optically-cured dielectric layer 40 to encapsulate the dies 60. The molding layer 70 may include molding compound such as epoxy and fillers such as silicon oxide fillers, and can be formed by molding operation with mold chase. In some embodiments, the molding layer 70 is in contact with the optically-cured dielectric layer 40.

Figure 2G:
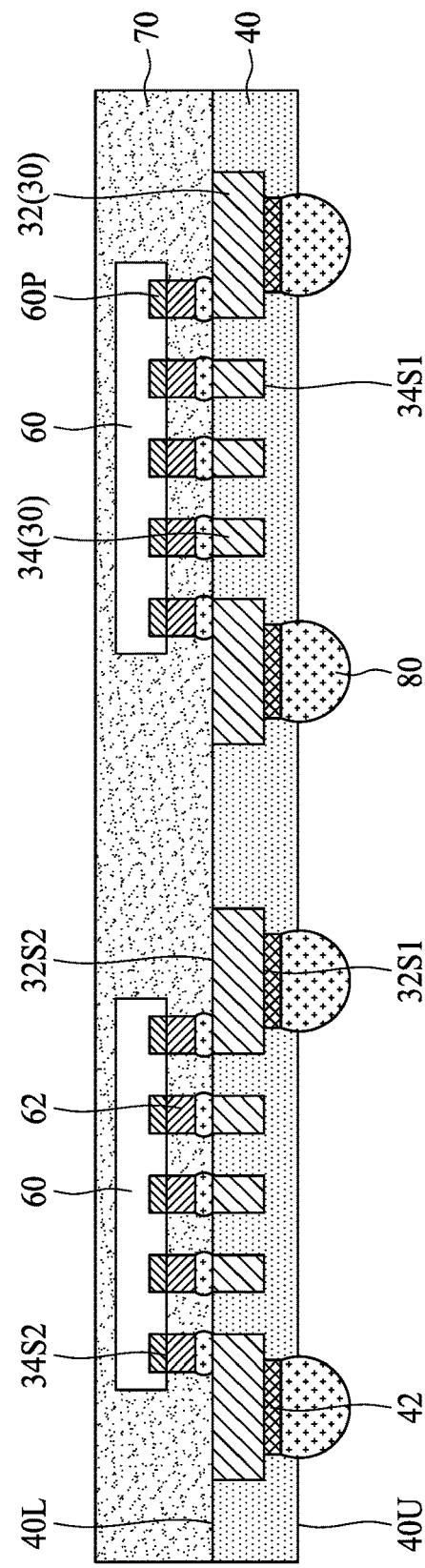

As shown in FIG. 2G, the sacrificial layer 50 is removed to expose the block layers 42. The sacrificial layer 50 may be removed by etching or other suitable process. The material of the block layers 42 is different from that of the sacrificial layer 50 such that the block layers 42 and the sacrificial layer 50 may have distinct etching selectivity. Accordingly, the block layers 42 may be configured as etching stop layers during etching the sacrificial layer 50, and the conductive pads 32 are not damaged during removal of the sacrificial layer 50. Examples of the material of the block layers 42 may include, but is not limited to, nickel (Ni), palladium (Pd), gold (Au) or a combination thereof, and example of the material of the sacrificial layer 50 and the conductive pad 32 may include, but is not limited to, copper. The block layers 42 may be a single-layered structure including nickel (Ni), palladium (Pd), gold (Au) or an alloy thereof, or a multi-layered structure with layers each including nickel (Ni), palladium (Pd) or gold (Au).

A plurality of electrical conductors 80 such as solder balls may be formed on the first surfaces 32S1 of the conductive pads 32 to facilitate external electrical connection to an external electrical component such as a printed circuit board (PCB) or the like. A singulation can be carried out to segment the package substrate 1, the dies 60 and the molding layer 70 into a plurality of semiconductor device packages 100.

The package substrate 1 includes the circuit layer 20 embedded in the optically-cured dielectric layer 40, and thus the thickness of the package substrate 1 can be reduced. The circuit layer 30 and the optically-cured dielectric layer 40 are temporarily supported by the sacrificial layer 50, which enhances the structural strength of the package substrate 1 and allows the package substrate 1 to be carried and handled in successive manufacturing operations. The sacrificial layer 50 can be removed after other electronic components such as semiconductor dies are disposed on the package substrate 1, and thus the overall thickness of the semiconductor device package 100 can be reduced.

The package substrates and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 3:
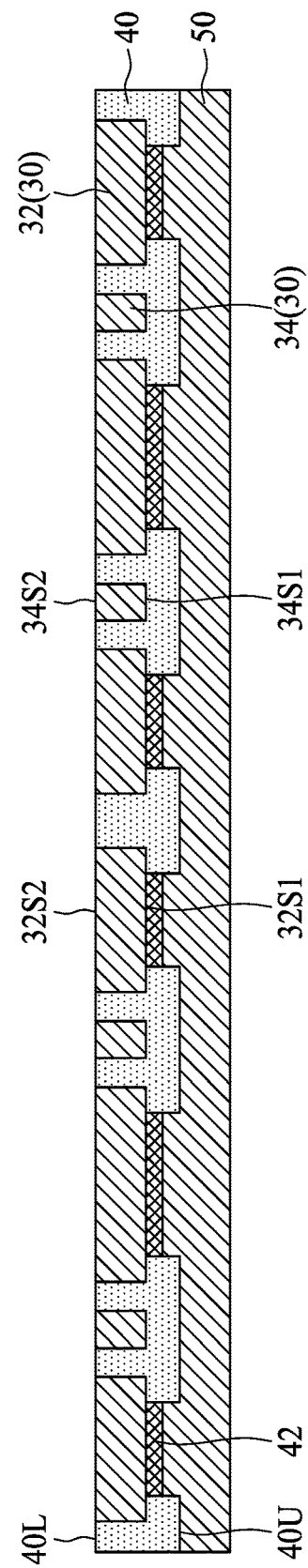
FIG. 3 is a schematic cross-sectional view of a package substrate 2 in accordance with some embodiments of the present disclosure.

FIG. 3 is a schematic cross-sectional view of a package substrate 2 in accordance with some embodiments of the present disclosure. As shown in FIG. 3, in contrast to the package substrate 1 as illustrated in FIG. 1, the layout of the conductive pads 32 and the conductive traces 34 of the package substrate 2 may be different from that of the package substrate 1. In some embodiments, the package substrate 2 may be configured to electrically connect semiconductor die(s) by wire boding.

Figure 4A:
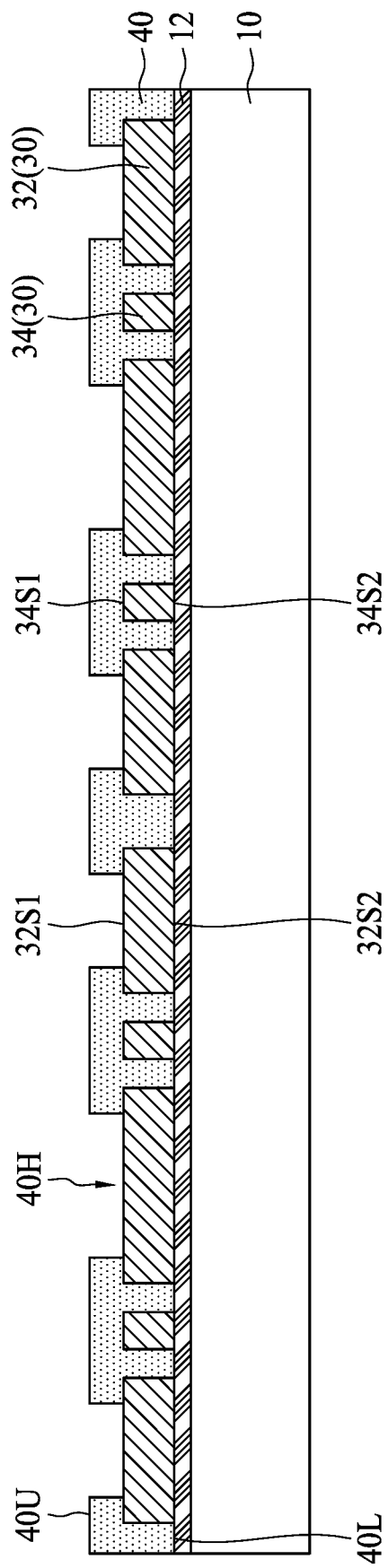
FIG. 4A, FIG. 4B, FIG. 4C and FIG. 4D illustrate operations of manufacturing a package substrate and a semiconductor device package in accordance with some embodiments of the present disclosure.
Figure 4B:
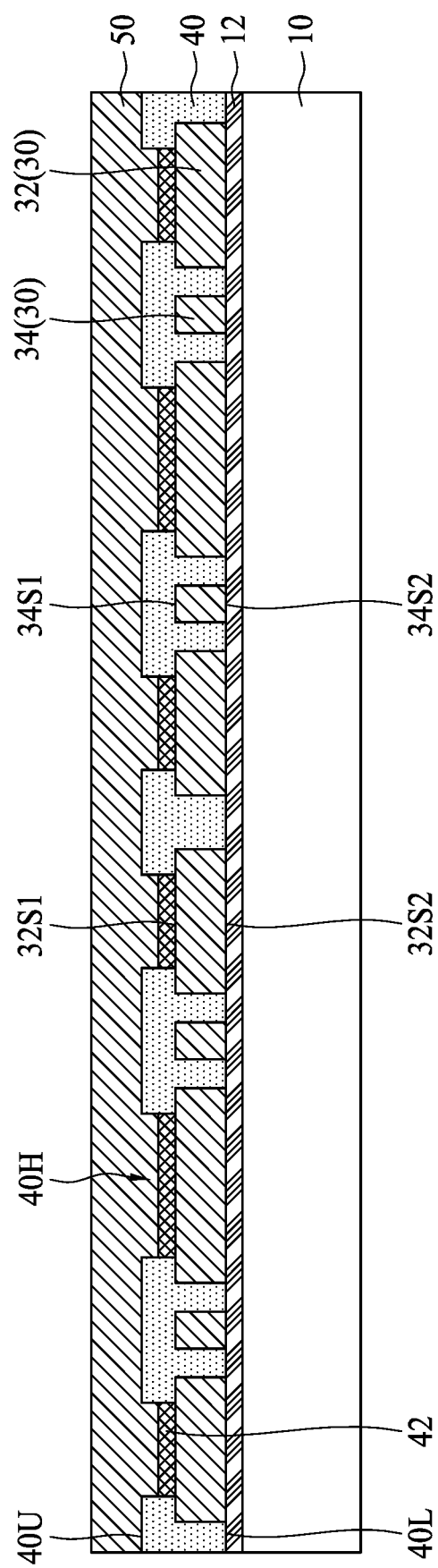

FIG. 4A, FIG. 4B, FIG. 4C and FIG. 4D illustrate operations of manufacturing a package substrate and a semiconductor device package in accordance with some embodiments of the present disclosure. As shown in FIG. 4A, a seed layer 12, a circuit layer 30 and an optically-cured dielectric layer 40 may be formed on a carrier 10. The seed layer 12, the circuit layer 20 and the optically-cured dielectric layer 40 may be formed by operations similar to that illustrated in FIG. 2A-FIG. 2D. As shown in FIG. 4B, a plurality of block layers 42 are formed in the openings 40H on the first surfaces 32S1 of the conductive pads 32. The block layers 42 may be formed by electroplating or other suitable process. A sacrificial layer 50 is formed on the optically-cured dielectric layer 40 and on the block layers 42. The sacrificial layer 50 can help to support the optically-cured dielectric layer 40 and the circuit layer 30, and thus the carrier 10 and the seed layer 12 can be removed from the optically-cured dielectric layer 40 to form the package substrate 2 as illustrated in FIG. 3.

Figure 4C:
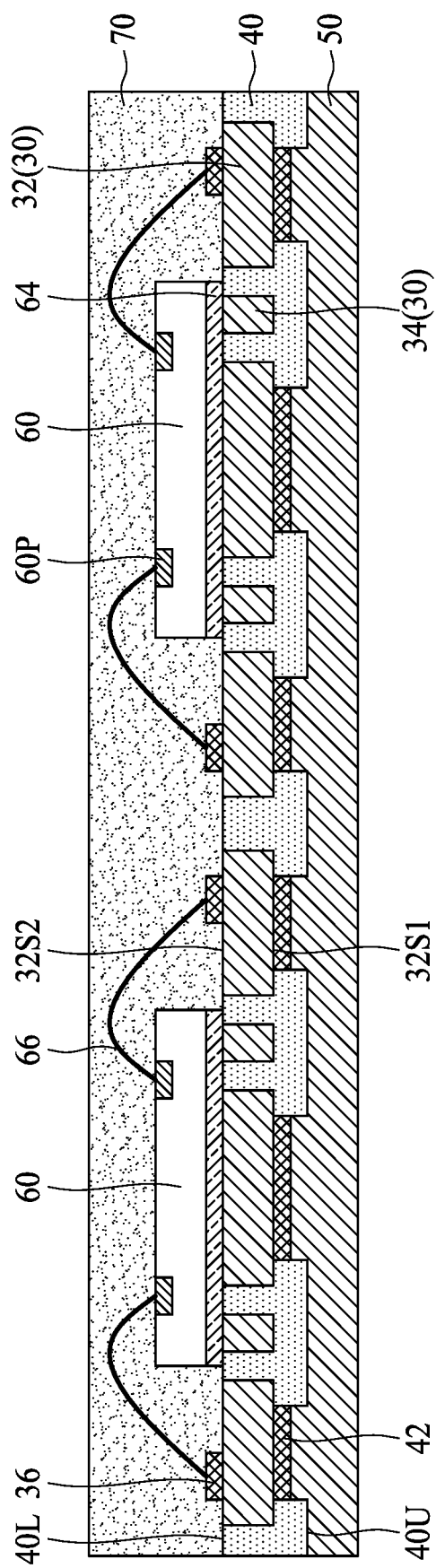

As shown in FIG. 4C, bonding pads 36 may be formed on the conductive pads 32. A plurality of dies 60 may be disposed on the optically-cured dielectric layer 40 and electrically connected to the conductive pads 32. In some embodiments, the die 60 may include electrical terminals 60P such as bonding pads opposite to the circuit layer 30. The inactive surface of the die 60 may be adhered to the optically-cured dielectric layer 40 by a die attach film (DAF) 64, and the die 60 may be electrically connected to the bonding pads 36 through bonding wires 66. The material of the bonding pad 36 may be such selected to enhance the adhesion between the bonding wire 66 and the bonding pad 36. The material of the bonding pad 36 may be different from that of the conductive pad 32. For example, the material of the bonding pad 36 may include gold (Au). A molding layer 70 may be formed on the optically-cured dielectric layer 40 to encapsulate the dies 60. The molding layer 70 may include molding compound such as epoxy and fillers such as silicon oxide fillers, and can be formed by molding operation with mold chase. In some embodiments, the molding layer 70 may be in contact with the optically-cured dielectric layer 40 and encapsulate the bonding wire 66.

Figure 4D:
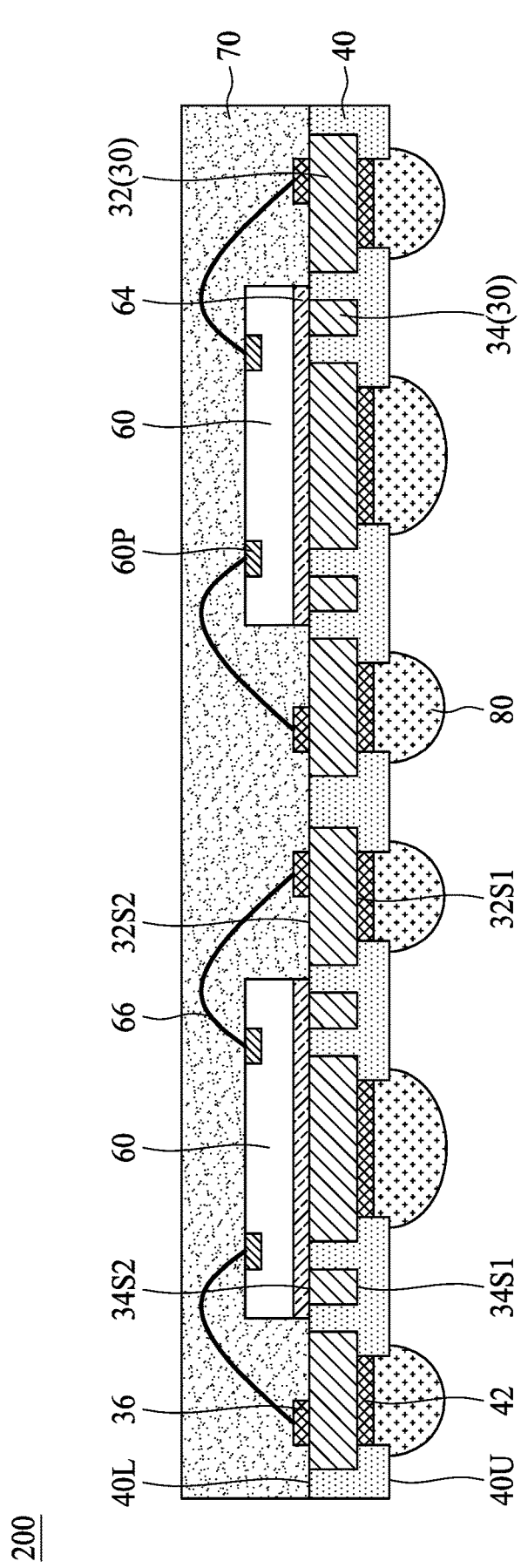

As shown in FIG. 4D, the sacrificial layer 50 is removed to expose the block layers 42. The sacrificial layer 50 may be removed by etching or other suitable process. The material of the block layers 42 is different from that of the sacrificial layer 50 such that the block layers 42 and the sacrificial layer 50 may have distinct etching selectivity. Accordingly, the block layers 42 may be configured as etching stop layers during etching the sacrificial layer 50, and the conductive pads 32 are not damaged during removal of the sacrificial layer 50. A plurality of electrical conductors 80 such as solder balls may be formed on the first surfaces 32S1 of the conductive pads 32 to facilitate external electrical connection to an external electrical component such as a printed circuit board (PCB) or the like. A singulation can be carried out to segment the package substrate 2, the dies 60 and the molding layer 70 into a plurality of semiconductor device packages 200.

Figure 5A:
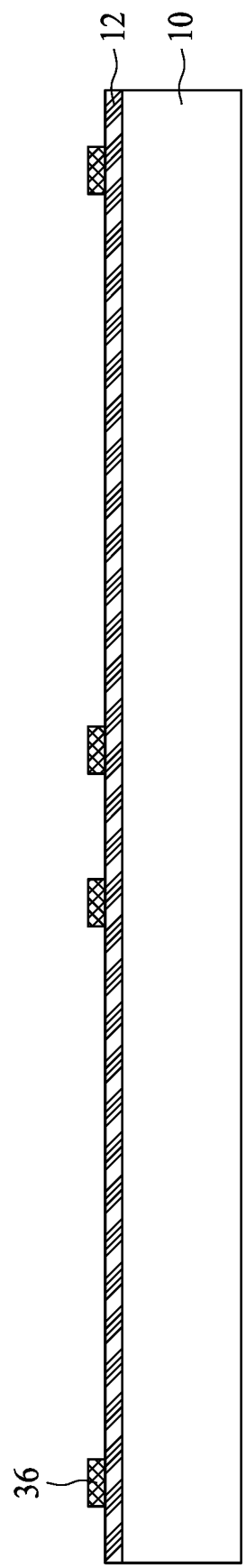
FIG. 5A and FIG. 5B illustrate operations of manufacturing a package substrate and a semiconductor device package in accordance with some embodiments of the present disclosure.
Figure 5B:
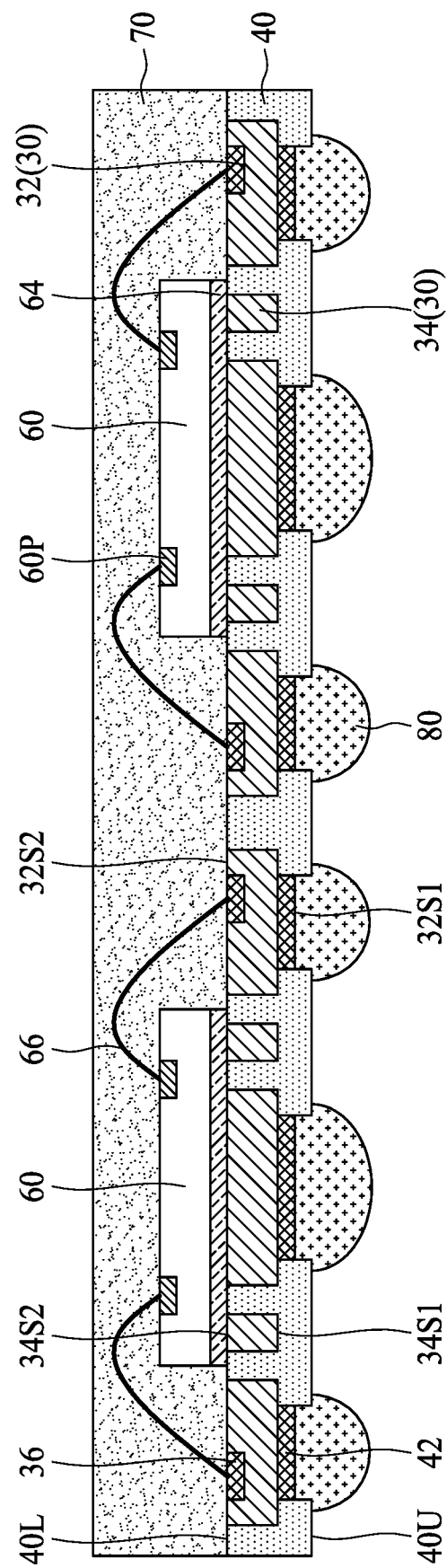

FIG. 5A and FIG. 5B illustrate operations of manufacturing a package substrate and a semiconductor device package in accordance with some embodiments of the present disclosure. As shown in FIG. 5A, in contrast to the operations illustrated in FIG. 4A-FIG. 4D, the bonding pads 36 are formed on the carrier 10 or the seed layer 12 prior to formation of the conductive pads 32. Accordingly, the bonding pads 36 may be partially embedded in the conductive pads 32 as shown in FIG. 5B.

Figure 6:
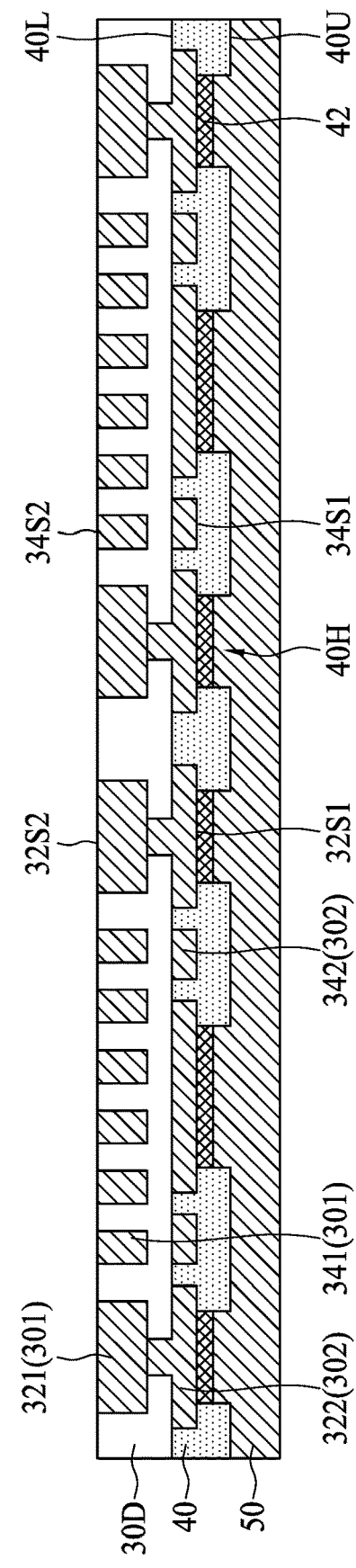
FIG. 6 is a schematic cross-sectional view of a package substrate 3 in accordance with some embodiments of the present disclosure.

FIG. 6 is a schematic cross-sectional view of a package substrate 3 in accordance with some embodiments of the present disclosure. As shown in FIG. 6, in contrast to the package substrate 1 as illustrated in FIG. 1, the circuit layer 30 includes a multi-layered circuit layer. The circuit layer 30 may include a first sub-circuit layer 301, a dielectric layer 30D and a second sub-circuit layer 302. The first sub-circuit layer 301 and the second sub-circuit layer 302 may be formed in different processes. The first sub-circuit layer 301 may include first portions 321 of the conductive pads 32, and the first portions 321 of the conductive pads 32 may include the second surfaces 32S2 of the conductive pads 32. The dielectric layer 30D is disposed on the lower surface 40L of the optically-cured dielectric layer 40 and partially covers the first portions 321 of the conductive pads 32. The material of the dielectric layer 30D may include organic dielectric material or inorganic dielectric material. The second sub-circuit layer 302 includes second portions 322 of the conductive pads 32, and the second portions 322 of the conductive pads 32 are partially covered by the optically-cured dielectric layer 40 and may include the first surfaces 32S1 of the conductive pads 32. The block layers 42 are respectively disposed on the first surfaces 32S1 of the conductive pads 32 exposed by the optically-cured dielectric layer 40. The sacrificial layer 50 is disposed on the optically-cured dielectric layer 40 and covers the block layers. 42.

Figure 7A:
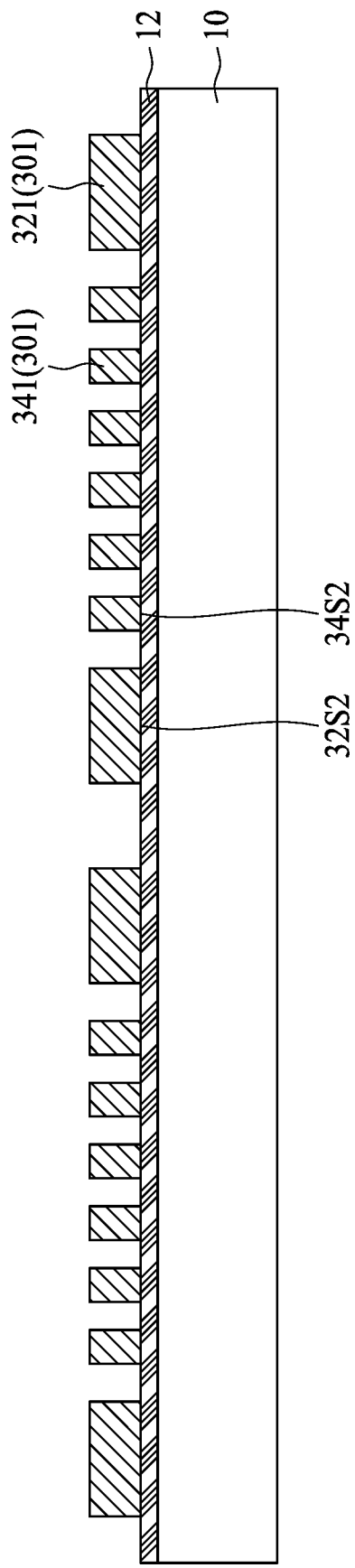
FIG. 7A, FIG. 7B, FIG. 7C, FIG. 7D, FIG. 7E and FIG. 7F illustrate operations of manufacturing a package substrate and a semiconductor device package in accordance with some embodiments of the present disclosure.
Figure 7B:
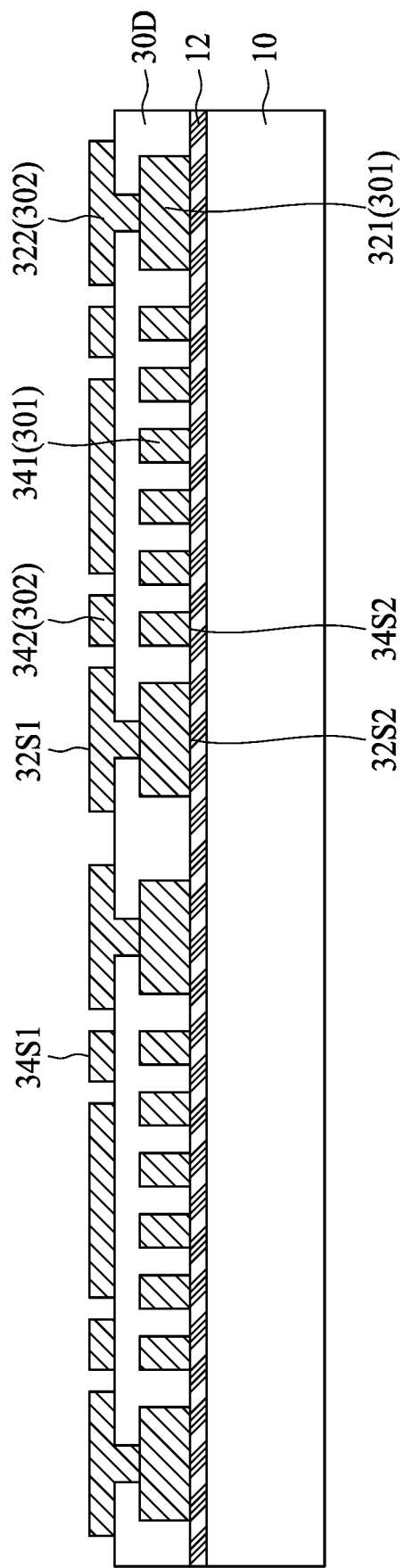

FIG. 7A, FIG. 7B, FIG. 7C, FIG. 7D, FIG. 7E and FIG. 7F illustrate operations of manufacturing a package substrate and a semiconductor device package in accordance with some embodiments of the present disclosure. As shown in FIG. 7A, a seed layer 12 may be formed on a carrier 10. A circuit layer 30 is then formed on the carrier 10. In some embodiments, the circuit layer 30 is formed by the operations as illustrated in FIG. 7A and FIG. 7B. As shown in FIG. 7A, a plurality of first portions 321 of conductive pads 32 and first portions 341 of conductive traces 34 are formed on the carrier 10. In some embodiments, the first portions 321 of the conductive pads 32 and the first portions 341 of the conductive traces 34 may be formed by electroplating, and patterned by a resist layer. As shown in FIG. 7B, a dielectric layer 30D is formed on the first portions 321 of the conductive pads 32 and the first portions 341 of the conductive traces 34. The dielectric layer 30D is patterned to partially expose the first portions 321 of the conductive pads 32. In some embodiments, the dielectric layer 30D may be patterned by drilling. In some embodiments, the dielectric layer 30D may include optically-sensitive material, and patterned by optical curing. A plurality of second portions 322 of conductive pads 32 and second portions 342 of conductive traces 34 are formed on the dielectric layer 30D. The second portions 322 of conductive pads 32 may penetrate through the dielectric layer 30D to electrical connect the first portions 321 of the conductive pads 32. The second portions 342 of conductive traces 34 may be directly connected to the first portions 34 of the conductive traces 34, or electrically connected to the first portions 34 of the conductive traces 34 through the conductive pads 32.

Figure 7C:
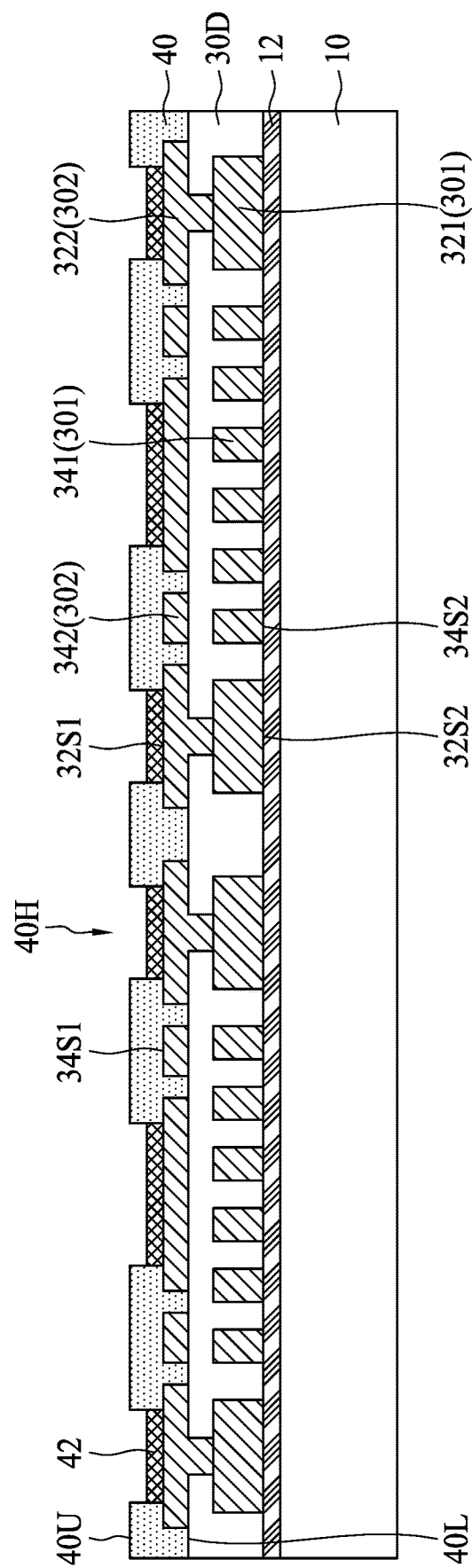

As shown in FIG. 7C, an optically-cured dielectric layer 40 is formed on the dielectric layer 30D. The optically-cured dielectric layer 40 can be patterned by optical curing to form a plurality of openings 40H at least partially exposing the first surfaces 32S1 of the conductive pads 32. A plurality of block layers 42 are formed in the openings 40H on the first surfaces 32S1 of the conductive pads 32. The block layers 42 may be formed by electroplating or other suitable process.

Figure 7D:
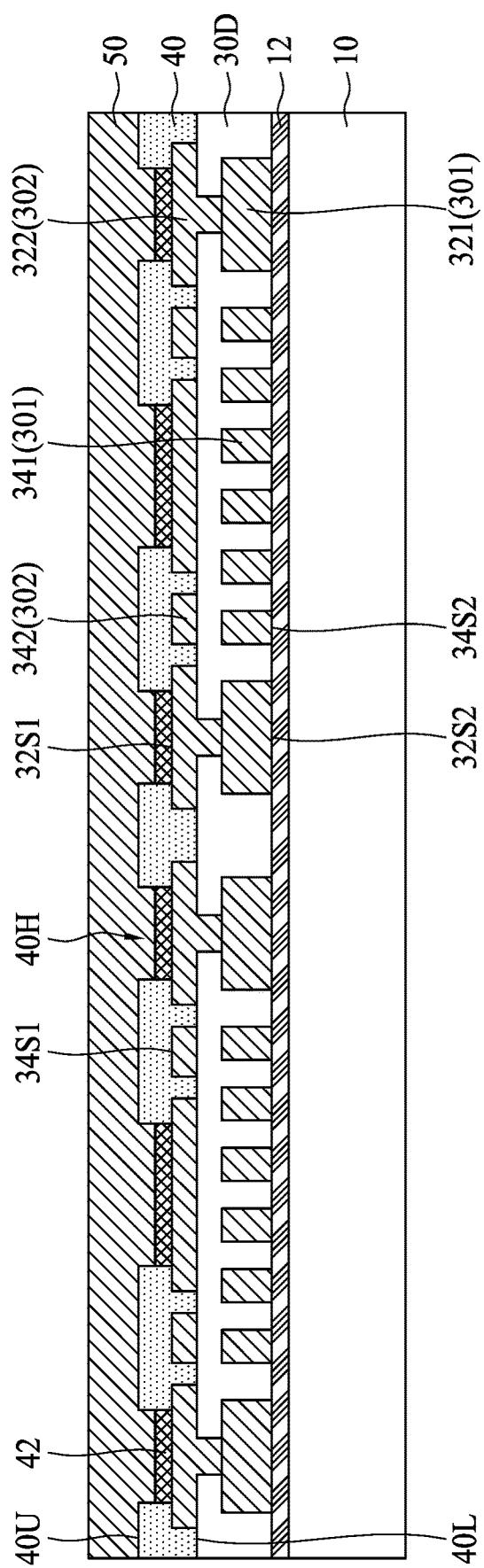

As shown in FIG. 7D, a sacrificial layer 50 is formed on the optically-cured dielectric layer 40 and on the block layers 42. In some embodiments, the sacrificial layer 50 includes a conductive layer such as a copper layer, and can be formed by electroplating or other suitable process. The sacrificial layer 50 can help to support the optically-cured dielectric layer 40 and the circuit layer 30, and thus the carrier 10 and the seed layer 12 can be removed from the optically-cured dielectric layer 40. In case the seed layer 12 exists, the lower surface 40L of the optically-cured dielectric layer 40 can be treated by e.g., etching to remove the seed layer 12 to form the package substrate 3 as illustrated in FIG. 3. In some embodiments, the second surfaces 32S2 of the conductive pads 32 can be slightly lower than or coplanar with the lower surface 40L of the optically-cured dielectric layer 40 after the surface treatment.

Figure 7E:
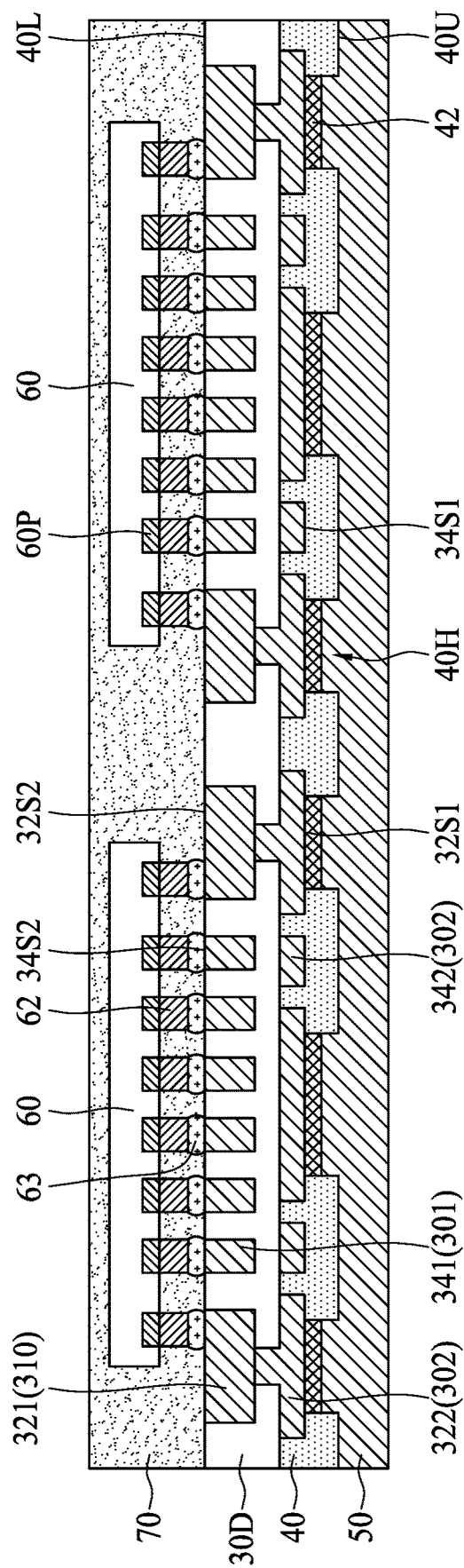

As shown in FIG. 7E, a plurality of dies 60 may be disposed on the optically-cured dielectric layer 40 and electrically connected to the conductive traces 34 and/or the conductive pads 32. In some embodiments, the dies 60 are electrically connected to the circuit layer 30 in a flip-chip manner. A molding layer 70 may be formed on the optically-cured dielectric layer 40 to encapsulate the dies 60. The molding layer 70 may include molding compound such as epoxy and fillers such as silicon oxide fillers, and can be formed by molding operation with mold chase. In some embodiments, the molding layer 70 is in contact with the optically-cured dielectric layer 40.

Figure 7F:
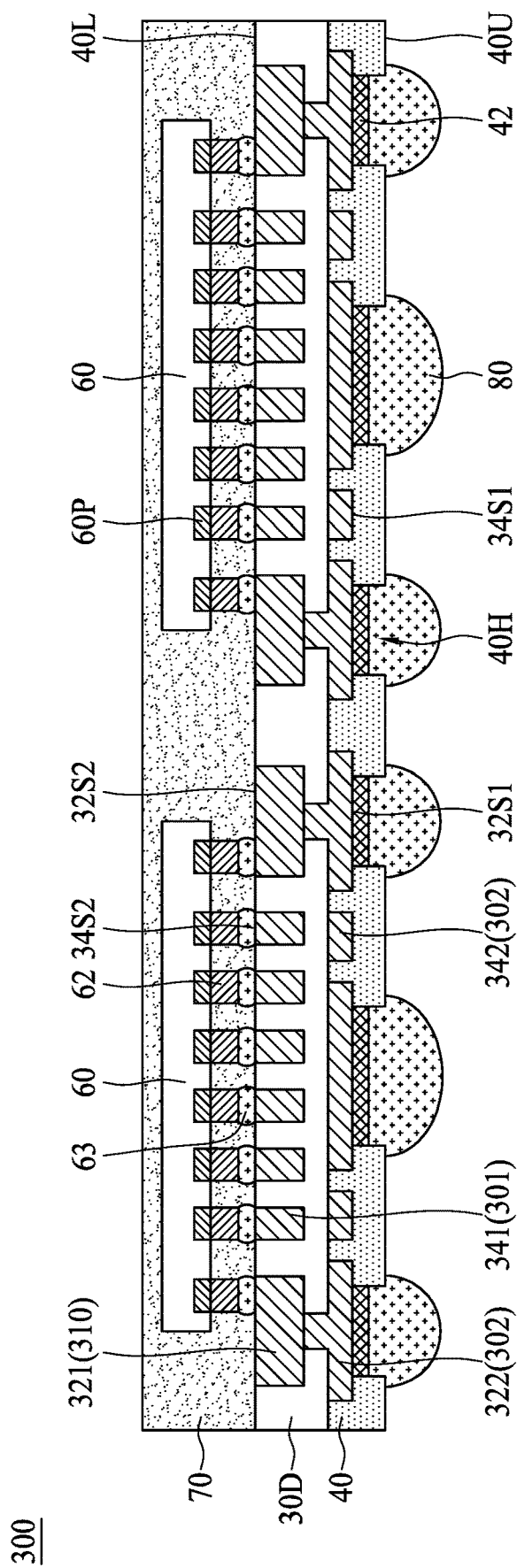

As shown in FIG. 7F, the sacrificial layer 50 is removed to expose the block layers 42. The sacrificial layer 50 may be removed by etching or other suitable process. The material of the block layers 42 is different from that of the sacrificial layer 50 such that the block layers 42 and the sacrificial layer 50 may have distinct etching selectivity. Accordingly, the block layers 42 may be configured as etching stop layers during etching the sacrificial layer 50, and the conductive pads 32 are not damaged during removal of the sacrificial layer 50. A plurality of electrical conductors 80 such as solder balls may be formed on the first surfaces 32S1 of the conductive pads 32 to facilitate external electrical connection to an external electrical component such as a printed circuit board (PCB) or the like. A singulation can be carried out to segment the package substrate 3, the dies 60 and the molding layer 70 into a plurality of semiconductor device packages 300.

Figure 8:
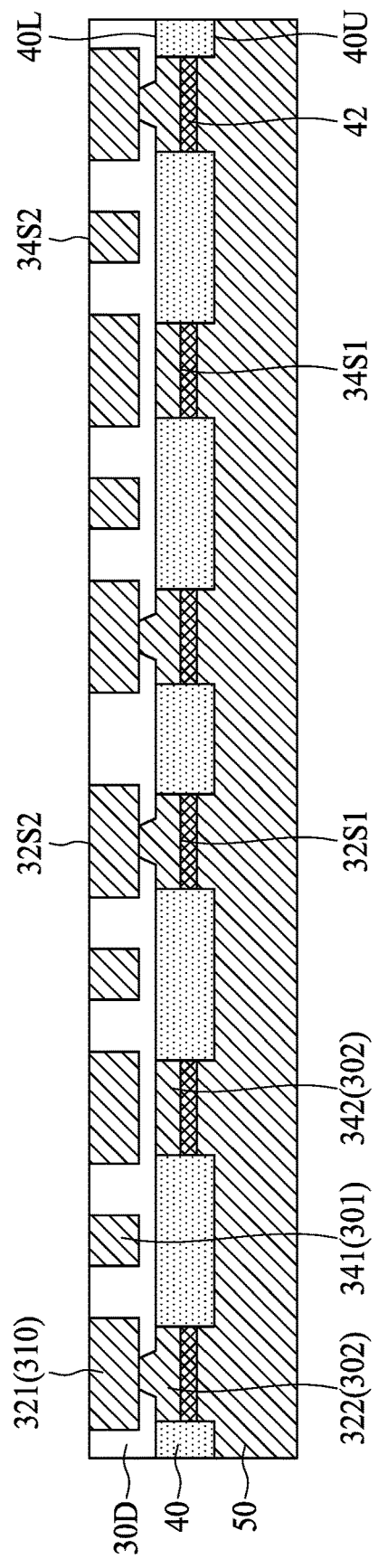
FIG. 8 is a schematic cross-sectional view of a package substrate 4 in accordance with some embodiments of the present disclosure.

FIG. 8 is a schematic cross-sectional view of a package substrate 4 in accordance with some embodiments of the present disclosure. As shown in FIG. 8, in contrast to the package substrate 3 as illustrated in FIG. 6, the layout of the conductive pads 32 and the conductive traces 34 of the package substrate 4 may be different from that of the package substrate 3. In some embodiments, the package substrate 4 may be configured to electrically connect semiconductor die(s) by wire bonding.

Figure 9A:
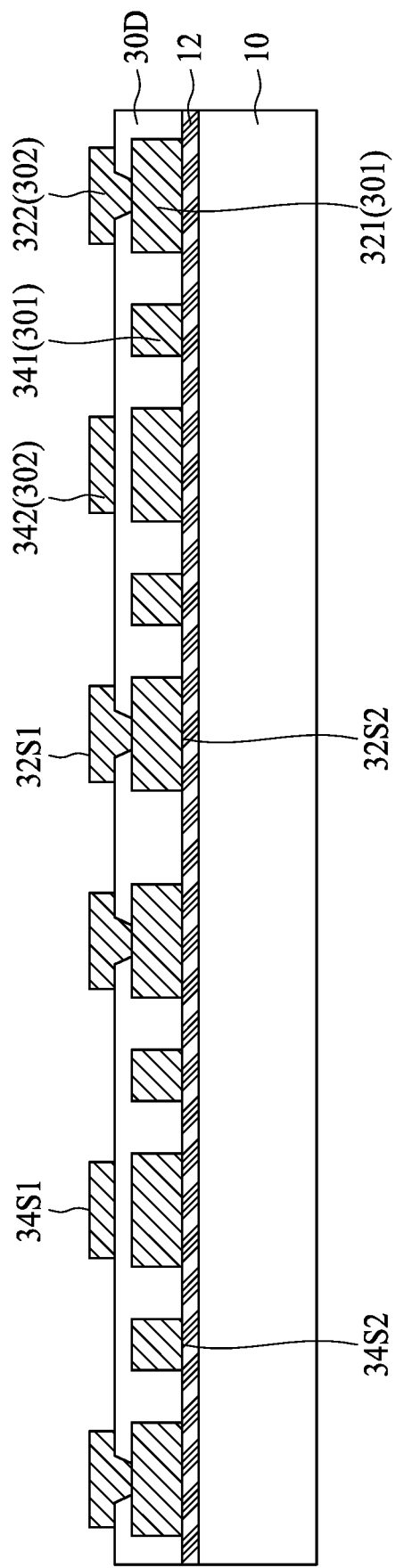
FIG. 9A, FIG. 9B, FIG. 9C, FIG. 9D and FIG. 9E illustrate operations of manufacturing a package substrate and a semiconductor device package in accordance with some embodiments of the present disclosure.

FIG. 9A, FIG. 9B, FIG. 9C, FIG. 9D and FIG. 9E illustrate operations of manufacturing a package substrate and a semiconductor device package in accordance with some embodiments of the present disclosure. As shown in FIG. 9A, a seed layer 12 may be formed on a carrier 10. A circuit layer 30 is then formed on the carrier 10. In some embodiments, the circuit layer 30 may include a multi-layered circuit layer, and formed by operations similar to that illustrated in FIG. 7A and FIG. 7B.

Figure 9B:
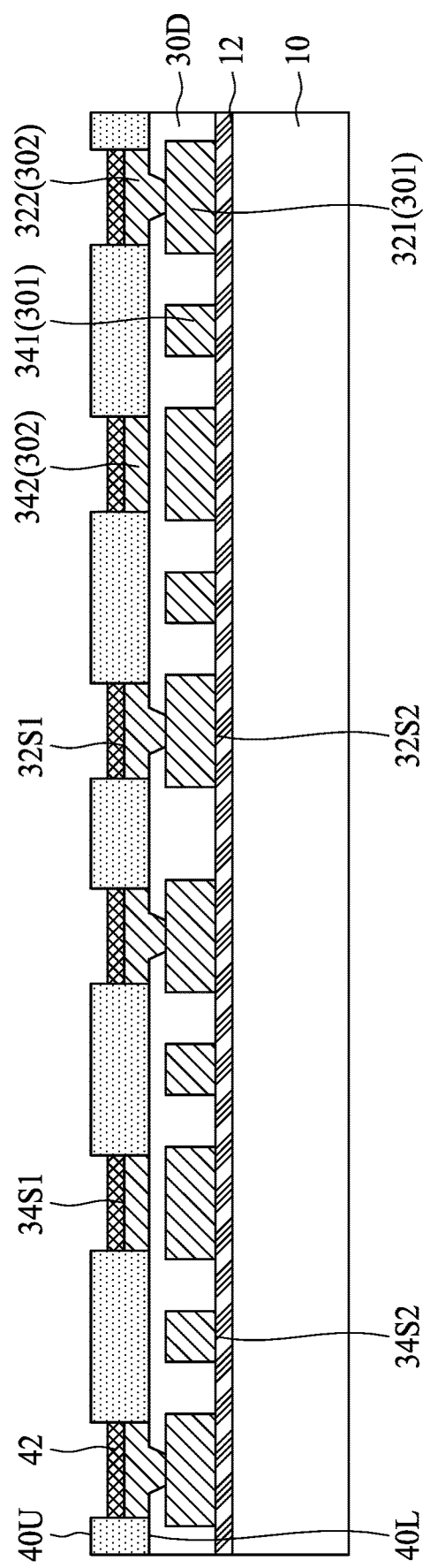

As shown in FIG. 9B, an optically-cured dielectric layer 40 is formed on the dielectric layer 30D. The optically-cured dielectric layer 40 can be patterned by optical curing to form a plurality of openings 40H at least partially exposing the first surfaces 32S1 of the conductive pads 32. A plurality of block layers 42 are formed in the openings 40H on the first surfaces 32S1 of the conductive pads 32. The block layers 42 may be formed by electroplating or other suitable process.

Figure 9C:
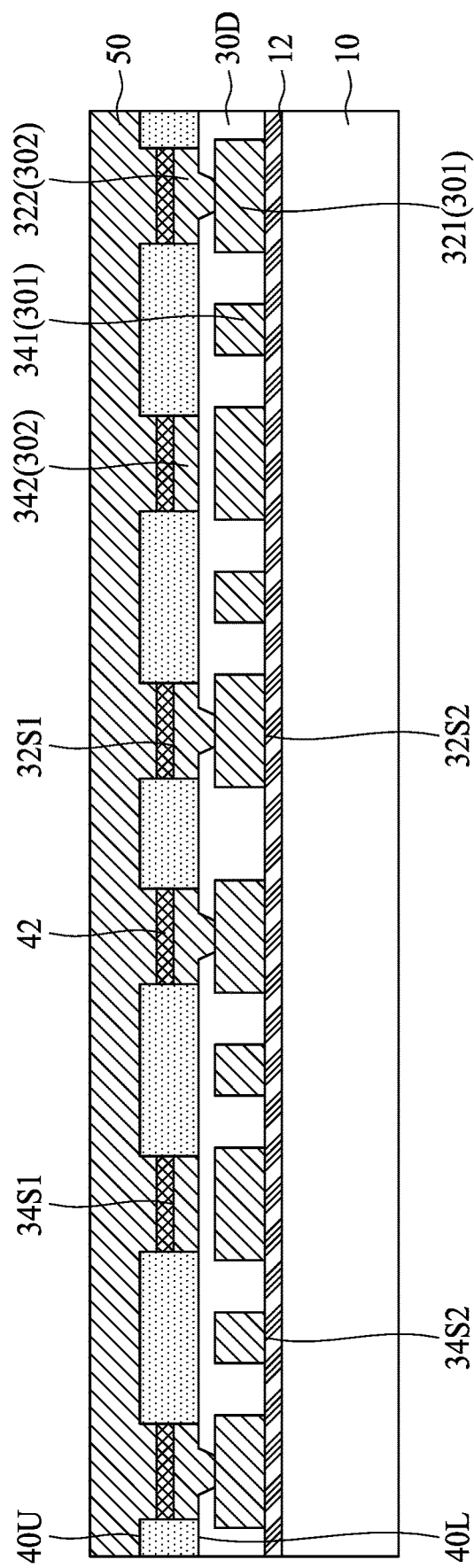

As shown in FIG. 9C, a sacrificial layer 50 is formed on the optically-cured dielectric layer 40 and on the block layers 42. In some embodiments, the sacrificial layer 50 includes a conductive layer such as a copper layer, and can be formed by electroplating or other suitable process. The sacrificial layer 50 can help to support the optically-cured dielectric layer 40 and the circuit layer 30, and thus the carrier 10 and the seed layer 12 can be removed from the optically-cured dielectric layer 40. In case the seed layer 12 exists, the lower surface 40L of the optically-cured dielectric layer 40 can be treated by e.g., etching to remove the seed layer 12 to form the package substrate 4 as illustrated in FIG. 8. In some embodiments, the second surfaces 32S2 of the conductive pads 32 can be slightly lower than or coplanar with the lower surface 40L of the optically-cured dielectric layer 40 after the surface treatment.

Figure 9D:
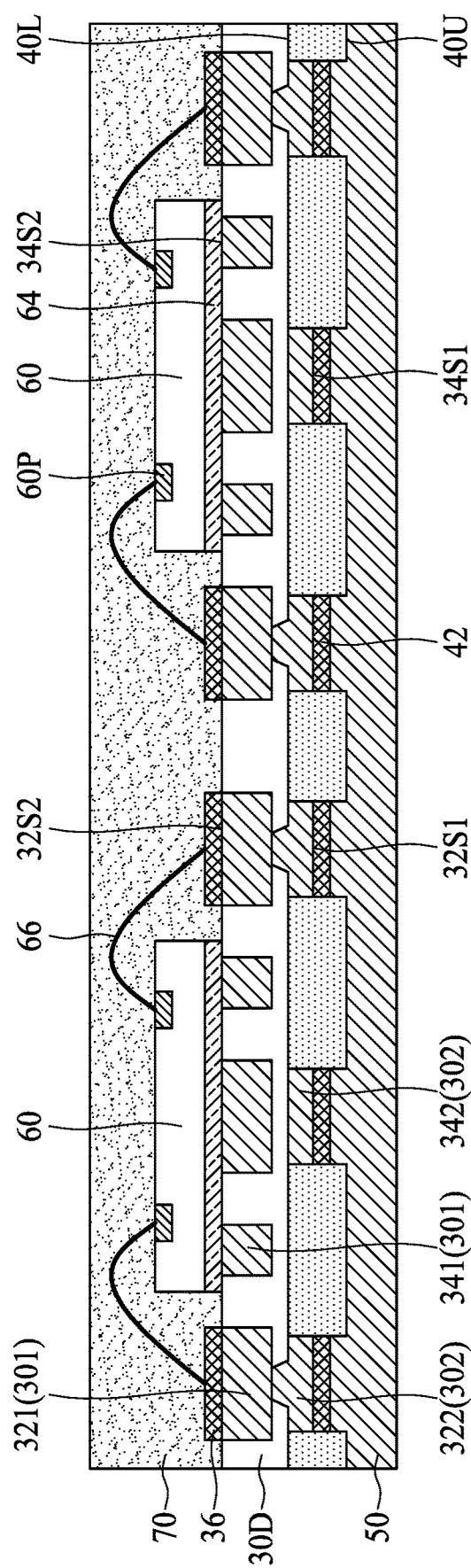

As shown in FIG. 9D, bonding pads 36 may be formed on the conductive pads 32. The width of the bonding pad 36 may be substantially the same as that of the conductive pad 32, but is not limited thereto. In some other embodiments, the bonding pads 36 may be formed prior to formation of the conductive pads 32, and thus may be embedded by the dielectric layer 30D. A plurality of dies 60 may be disposed on the optically-cured dielectric layer 40 and electrically connected to the conductive pads 32. In some embodiments, the die 60 may include electrical terminals 60P such as bonding pads opposite to the circuit layer 30. The inactive surface of the die 60 may be adhered to the optically-cured dielectric layer 40 by a die attach film (DAF) 64, and the die 60 may be electrically connected to the bonding pads 36 through bonding wires 66. A molding layer 70 may be formed on the optically-cured dielectric layer 40 to encapsulate the dies 60. The molding layer 70 may include molding compound such as epoxy and fillers such as silicon oxide fillers, and can be formed by molding operation with mold chase. In some embodiments, the molding layer 70 may be in contact with the optically-cured dielectric layer 40 and encapsulate the bonding wire 66.

Figure 9E:
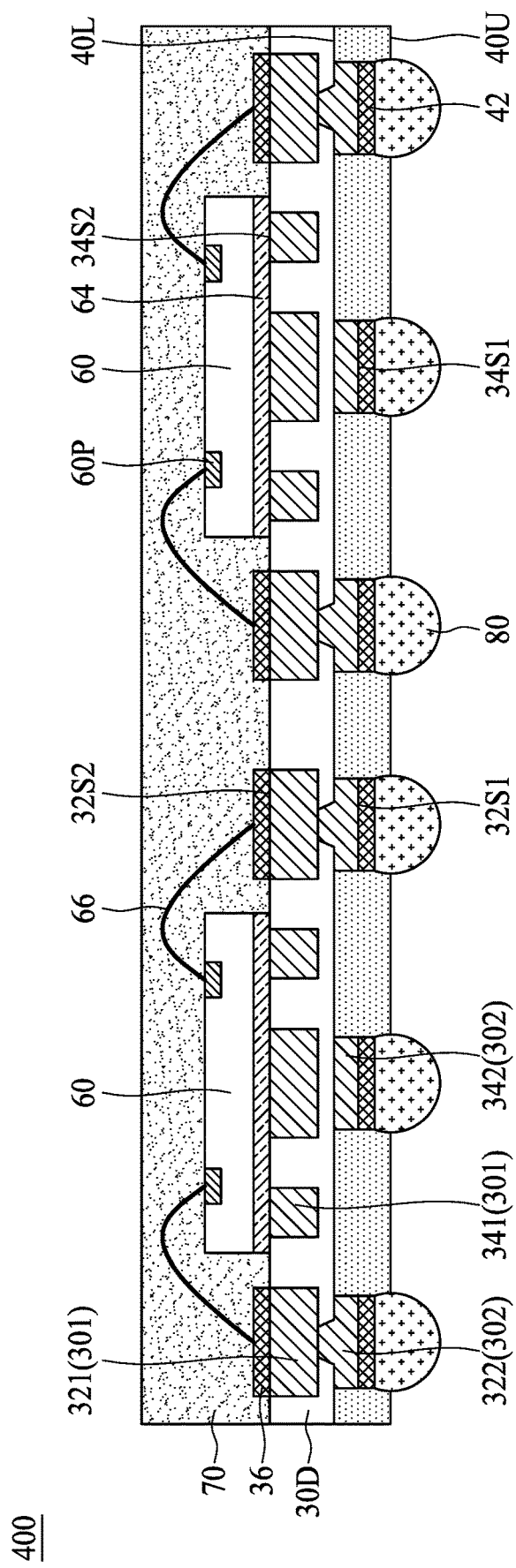

As shown in FIG. 9E, the sacrificial layer 50 is removed to expose the block layers 42. The sacrificial layer 50 may be removed by etching or other suitable process. The material of the block layers 42 is different from that of the sacrificial layer 50 such that the block layers 42 and the sacrificial layer 50 may have distinct etching selectivity. Accordingly, the block layers 42 may be configured as etching stop layers during etching the sacrificial layer 50, and the conductive pads 32 are not damaged during removal of the sacrificial layer 50. A plurality of electrical conductors 80 such as solder balls may be formed on the first surfaces 32S1 of the conductive pads 32 to facilitate external electrical connection to an external electrical component such as a printed circuit board (PCB) or the like. A singulation can be carried out to segment the package substrate 2, the dies 60 and the molding layer 70 into a plurality of semiconductor device packages 400.

In some embodiments of the present disclosure, the package substrate includes a circuit layer embedded in an optically-cured dielectric layer, and thus the thickness of the package substrate can be reduced. The package substrate further includes a sacrificial layer to temporarily support the circuit layer and the optically-cured dielectric layer to enhance the structural strength of the package substrate, and allows the package substrate to be carried and handled in successive manufacturing operations. The sacrificial layer can be removed after other electronic components such as semiconductor dies are disposed on the package substrate, and thus the overall thickness of the semiconductor device package can be reduced. The optically-cured dielectric layer can be patterned by optical curing such as UV curing rather than grinding, and thus no additional thickness for the thickness tolerance of grinding process is required. Accordingly, the thickness of the package substrate can be further thinned.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A package substrate, comprising:
    a circuit layer, comprising a plurality of conductive pads;
    an optically-cured dielectric layer having an upper surface and a lower surface opposite to the upper surface, wherein the optically-cured dielectric layer covers the circuit layer and defines openings exposing at least a portion of first surfaces of the conductive pads;
    a plurality of block layers respectively disposed on the first surfaces of the conductive pads exposed by the openings of the optically-cured dielectric layer, wherein upper surfaces of the block layers are lower than the upper surface of the optically-cured dielectric layer; and
    a sacrificial layer disposed on the optically-cured dielectric layer, extending into the openings of the optically-cured dielectric layer and covering the block layers,
    wherein a thickness of the sacrificial layer is larger than a thickness of the optically-cured dielectric layer.

2. The package substrate of claim 1, wherein edges of the conductive pads are covered by the optically-cured dielectric layer.

3. The package substrate of claim 1, wherein the circuit layer comprises a single-layered circuit layer, and second surfaces of the conductive pads are exposed from the lower surface of optically-cured dielectric layer, and the second surfaces of the conductive pads and the lower surface of the optically-cured dielectric layer are substantially coplanar.

4. The package substrate of claim 1, wherein the circuit layer comprises a multi-layered circuit layer comprising:
    a first sub-circuit layer comprising first portions of the conductive pads, wherein the first portions of the conductive pads have second surfaces of the conductive pads;
    a dielectric layer disposed on the lower surface of the optically-cured dielectric layer and partially covering the first portions of the conductive pads; and
    a second sub-circuit layer comprising second portions of the conductive pads, wherein the second portions of the conductive pads are partially covered by the optically-cured dielectric layer and have the first surfaces of the conductive pads.

5. The package substrate of claim 1, wherein the circuit layer further comprises a plurality of conductive traces partially covered by the optically-cured dielectric layer, and the conductive traces and the conductive pads are substantially equal in thickness and are disposed at substantially a same level.

6. The package substrate of claim 1, wherein a thickness of the optically-cured dielectric layer is less than about 40 micrometers.

7. The package substrate of claim 1, wherein the sacrificial layer contacts sidewalls of the openings of the optically-cured dielectric layer.

8. The package substrate of claim 1, further comprising a die disposed adjacent to the lower surface of the optically-cured dielectric layer and a molding layer disposed on the lower surface of the optically-cured dielectric layer, wherein a projection area of the first surface of the conductive pad on the lower surface of the optically-cured dielectric layer extends beyond that of the die.

9. The package substrate of claim 8, wherein the die electrically connects to the conductive pad through a bonding wire and the die adheres to the lower surface of the optically-cured dielectric layer by a die attach film.

10. The package substrate of claim 1, wherein the sacrificial layer comprises a conductive layer.

11. The package substrate of claim 1, wherein the sacrificial layer is configured as a temporary enhancement layer.

12. A method of manufacturing a package substrate, comprising:
    forming a circuit layer comprising a plurality of conductive pads on a carrier;
    forming an optically-sensitive material covering the conductive pads;
    optically curing the optically-sensitive material to form an optically-cured dielectric layer having a plurality of openings partially exposing first surfaces of the conductive pads;
    forming a plurality of block layers in the openings on the first surfaces of the conductive pads, wherein upper surfaces of the block layers are lower than an upper surface of the optically-cured dielectric layer; and
    forming a sacrificial layer on the optically-cured dielectric layer and extending into the openings of the optically-cured dielectric layer and on the block layers.

13. The method of claim 12, wherein forming the sacrificial layer on the optically-cured dielectric layer and extending into the openings of the optically-cured dielectric layer and on the block layers comprises electroplating a conductive layer on the block layers and the optically-cured dielectric layer as the sacrificial layer.

14. The method of claim 13, further comprising etching the conductive layer using the block layers as etching stop layers.

15. The method of claim 12, further comprising:
    forming a seed layer on the carrier prior to forming the circuit layer; and
    forming the circuit layer on the seed layer by electroplating.

16. The method of claim 15, further comprising:
removing the carrier; and
removing the seed layer from the optically-cured dielectric layer to expose second surfaces of the conductive pads.

17. The method of claim 12, further comprising forming a plurality of conductive traces simultaneously with the conductive pads.

18. A method of manufacturing a semiconductor device package, comprising:
providing the package substrate of claim 13;
disposing a die on the optically-cured dielectric layer and electrically connecting the die to the conductive pads;
forming a molding layer on the optically-cured dielectric layer to encapsulate the die;
removing the sacrificial layer from the optically-cured dielectric layer and the block layers; and
forming a plurality of electrical conductors on the block layers.

19. The method of claim 14, wherein forming the sacrificial layer on the optically-cured dielectric layer comprises forming the sacrificial layer to contact sidewalls of the openings of the optically-cured dielectric layer.

20. The method of claim 14, further comprising:
disposing a die adjacent to a lower surface of the optically-cured dielectric layer that is opposite to the upper surface; and
disposing a molding layer on the lower surface of the optically-cured dielectric layer, wherein a projection area of the first surface of the conductive pad on the lower surface of the optically-cured dielectric layer extends beyond that of the die.

21. The method of claim 20, wherein disposing the die adjacent to the lower surface of the optically-cured dielectric layer comprises disposing the die on the lower surface of the optically-cured dielectric layer by a die attach film and electrically connecting the die to the conductive pad through a bonding wire.

* * * * *